US009939807B2

(12) United States Patent
Walker, Jr.

(10) Patent No.: US 9,939,807 B2
(45) Date of Patent: Apr. 10, 2018

(54) SYSTEMS AND METHODS FOR CONSTRUCTION ABSTRACTION

(71) Applicant: Lynwood J. Walker, Jr., Hahnville, LA (US)

(72) Inventor: Lynwood J. Walker, Jr., Hahnville, LA (US)

( * ) Notice: Subject to any disclaimer, the term of this patent is extended or adjusted under 35 U.S.C. 154(b) by 1080 days.

(21) Appl. No.: 14/089,817

(22) Filed: Nov. 26, 2013

(65) Prior Publication Data

US 2014/0156049 A1   Jun. 5, 2014

Related U.S. Application Data

(60) Provisional application No. 61/732,212, filed on Nov. 30, 2012.

(51) Int. Cl.
G06F 17/50 (2006.01)
G05B 19/4097 (2006.01)
(Continued)

(52) U.S. Cl.
CPC .......... *G05B 19/4097* (2013.01); *E04C 2/00* (2013.01); *G06F 17/50* (2013.01); *E04B 2/60* (2013.01);
(Continued)

(58) Field of Classification Search
CPC .. G06F 17/50; G06F 17/5004; G06F 17/5009; G06F 17/60; G06F 2217/34; G06F 2217/36; G06F 2217/42; G06F 2217/04; G06T 17/00; Y10T 29/49629; E04B 1/343; E04B 1/14; E04B 1/2403; E04B 1/58; E04B 1/34378; E04B 1/5831; E04B 2/60; E04B 2/7453; E04B 2/78; E04B 2/7854; E04B 2/822; E04B 2/14; E04B 2001/3577; E04B 2001/2451; E04B 2001/2469;
(Continued)

(56) References Cited

U.S. PATENT DOCUMENTS 2,634,534 A * 4/1953 Brown .................... B44C 1/005
144/332
3,751,865 A * 8/1973 Brigham ............. E04B 1/34326
52/474
(Continued)

FOREIGN PATENT DOCUMENTS

KR   10-2001-0079305   8/2001

OTHER PUBLICATIONS

J. D. M. Mogollon, "Automation of Design and Drafting for Wood Frame Structures and Construction Waste Minimization," PhD. Thesis, Department of Civil and Environmental Engineering, Hole School of Construction Engineering and Management, 2009, 208 pages.*
(Continued)

*Primary Examiner* — Aniss Chad
*Assistant Examiner* — David M Rogers
(74) *Attorney, Agent, or Firm* — DLA Piper LLP US

(57) ABSTRACT

A frame design and a sheathing design for a design model may be produced by the systems and methods described herein. A processor in communication with a database may receive a design model comprising building specifications. The processor may define a panel in the design model and generate the frame design and the sheathing design for the panel.

56 Claims, 40 Drawing Sheets

(51) Int. Cl.
*E04C 2/00* (2006.01)
*E04F 13/14* (2006.01)
*F16B 12/02* (2006.01)
*E04B 2/60* (2006.01)

(52) U.S. Cl.
CPC .............. *E04F 13/14* (2013.01); *F16B 12/02* (2013.01); *G05B 2219/45174* (2013.01); *G05B 2219/45234* (2013.01); *G05B 2219/49389* (2013.01); *Y10T 29/49629* (2015.01)

(58) Field of Classification Search
CPC ..... E04B 2001/5868; E04B 2001/2406; E04B 2001/3583; E04B 2001/5856; E04B 2002/567; E04B 2002/0269; E04B 5/02; E04B 5/023; E04B 5/16; E04B 5/23; E04B 5/29; E04B 5/10; E04B 7/026; E04B 9/0407; E04B 9/0414; E04C 2/00; E04C 2/34; E04C 3/02; E04C 5/0627; E04C 5/0631; E04F 13/14; E04F 13/00; E04H 4/0087; E04H 4/0093; E04H 17/16; E04H 17/161; E04H 17/163; E04H 17/165; E04H 17/166; E04H 17/168; E04H 17/18; F16B 12/02; A47B 47/0008; B44C 3/12
USPC ............. 703/1, 6; 700/97, 98; 345/419, 420; 382/285
See application file for complete search history.

(56) References Cited

U.S. PATENT DOCUMENTS

| | | | | |
|---|---|---|---|---|
| 4,969,302 | A * | 11/1990 | Coggan | ............ E04F 13/0864 52/309.8 |
| 5,224,318 | A * | 7/1993 | Kemerer | ............ E04F 13/0864 52/520 |
| 6,295,513 | B1 | 9/2001 | Thackston | |
| 6,681,140 | B1 * | 1/2004 | Heil | ........................ B27F 1/02 700/160 |
| 6,928,596 | B2 | 8/2005 | Thackston | |
| 7,389,255 | B2 * | 6/2008 | Formisano | ....... G06Q 10/06313 705/7.23 |
| 7,974,817 | B2 | 7/2011 | Nishikawa et al. | |
| 2004/0073410 | A1 | 4/2004 | Maly et al. | |
| 2004/0237439 | A1 * | 12/2004 | Powell | .................... E04B 1/20 52/505 |
| 2007/0271073 | A1 * | 11/2007 | Mifsud | ................ B21F 27/128 703/1 |
| 2009/0319237 | A1 | 12/2009 | Nishikawa et al. | |
| 2010/0057242 | A1 * | 3/2010 | Williams | .............. B25J 9/0009 700/114 |
| 2010/0274374 | A1 | 10/2010 | Konstantinidis | |
| 2011/0054652 | A1 * | 3/2011 | Heil | .................. G05B 19/4097 700/98 |
| 2012/0060662 | A1 * | 3/2012 | Hinshaw | ............. B23D 45/048 83/364 |
| 2012/0066019 | A1 * | 3/2012 | Hinshaw | ............... G06Q 10/06 705/7.23 |

OTHER PUBLICATIONS

T. Korman, et al., "Using Building Information Modeling to Improve the Mechanical, Electrical, and Plumbing Coordination Process for Buildings," AEI 2008: Building Integration Solutions, ASCE, 10 pages.*

Graphisoft, "ArchiCAD 10 New Features Guide," Graphisoft, 2006, 120 pages.*

International Search Report and Written Opinion of the International Searching Authority issued in PCT/US2013/071780 dated Mar. 10, 2014.

English Language for KR 10-2001-0079305 published Aug. 22, 2001.

* cited by examiner

Ribs created with cavity algorithm

Ribs created with cavity algorithm

Line of Best Fit

Sliding Joint is used as one form of connecting floors to panels. Screws are used to secure the female-component to the foundation Alternative Foundation to Panel Joint has the bottom frame slightly elongated with screws used for securing all to the foundation.

The Panel frames meet at a shared plane.

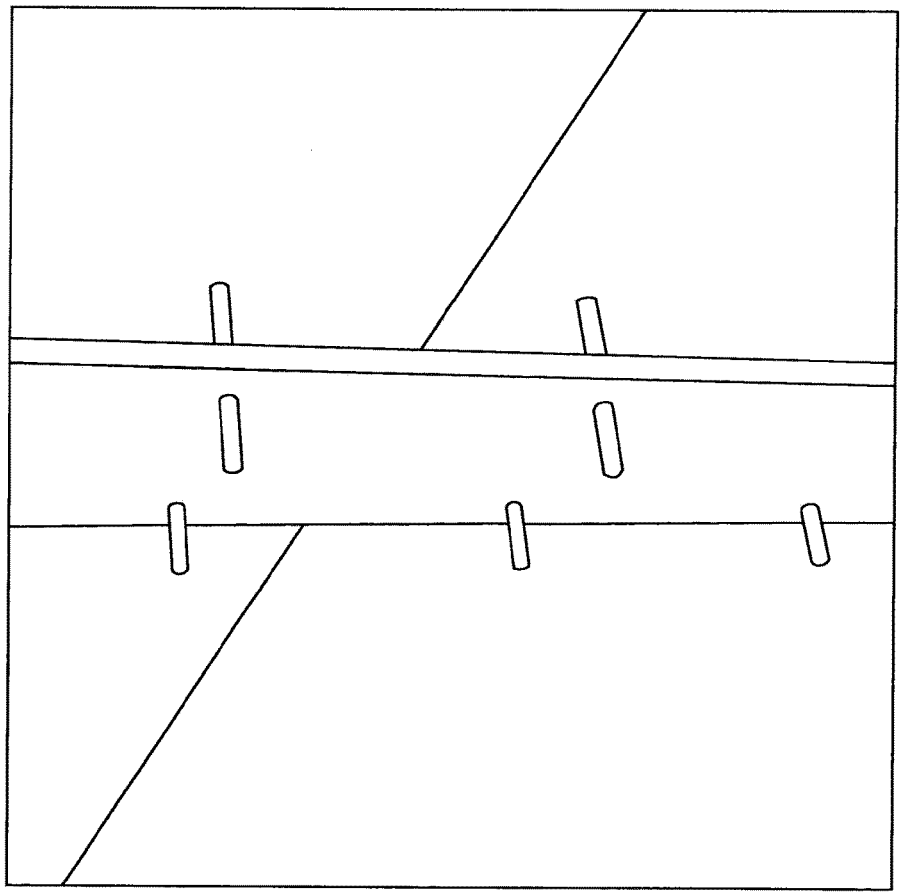

The holes may be multilayered, off varying sizes, and shapes to accommodate alternative systems

SYSTEMS AND METHODS FOR CONSTRUCTION ABSTRACTION

CROSS-REFERENCE TO RELATED APPLICATIONS

This application is based on and derives the benefit of the filing date of U.S. Provisional Patent Application No. 61/732,212, filed Nov. 30, 2012. The entire content of this application is herein incorporated by reference in its entirety.

BRIEF DESCRIPTION OF THE DRAWINGS

FIG. 25E is a design model according to an embodiment of the invention.

DETAILED DESCRIPTION OF SEVERAL EMBODIMENTS

Systems and methods described herein may parse information inherent to three dimensional (3D) digital design models to enable structure design and/or control of automated machinery in the fabrication of physical structures. This may involve the preparation of data, the abstraction of the data through a series of algorithmic manipulations, and the resultant generation of display data and/or control of machinery in the fabrication of structural components.

The systems and methods described herein may comprise one or more computers. A computer may be any programmable machine capable of performing arithmetic and/or logical operations. In some embodiments, computers may comprise processors, memories, data storage devices, and/or other commonly known or novel components. These components may be connected physically or through network or wireless links. Computers may also comprise software which may direct the operations of the aforementioned components. Computers may be referred to with terms that are commonly used by those of ordinary skill in the relevant arts, such as servers, PCs, mobile devices, and other terms. Computers may facilitate communications between users, may provide databases, may perform analysis and/or transformation of data, and/or perform other functions. It will be understood by those of ordinary skill that those terms used herein are interchangeable, and any computer capable of performing the described functions may be used. For example, though the term "server" may appear in the following specification, the disclosed embodiments are not limited to servers.

Computers may be linked to one another via a network or networks. A network may be any plurality of completely or partially interconnected computers wherein some or all of the computers are able to communicate with one another. It will be understood by those of ordinary skill that connections between computers may be wired in some cases (i.e. via Ethernet, coaxial, optical, or other wired connection) or may be wireless (i.e. via Wi-Fi, WiMax, or other wireless connection). Connections between computers may use any protocols, including connection oriented protocols such as TCP or connectionless protocols such as UDP. Any connection through which at least two computers may exchange data can be the basis of a network.

Figure 1:
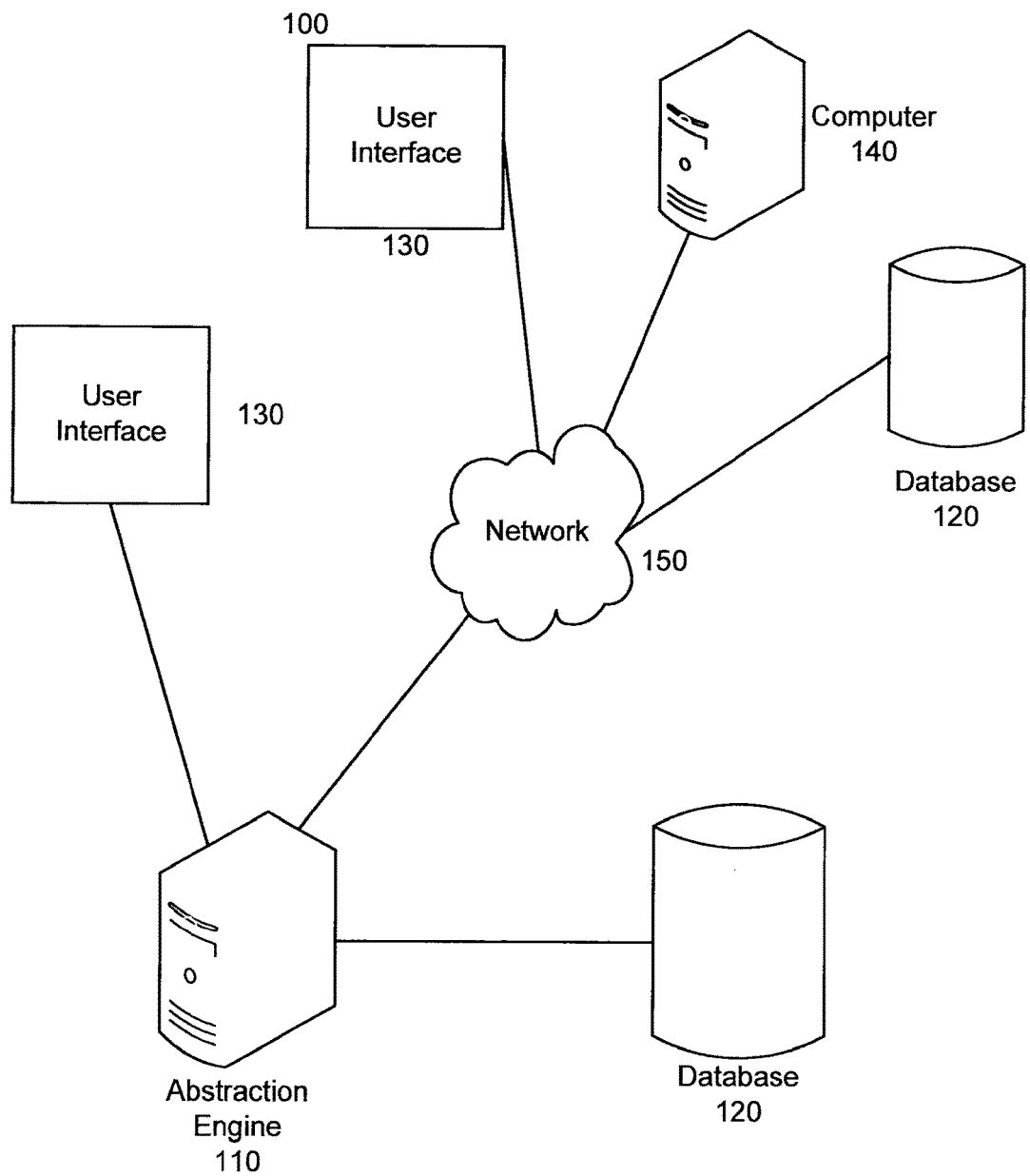
FIG. 1 is a network according to an embodiment of the invention.

FIG. 1 depicts a network 100 according to an embodiment of the invention. The network 100 may include one or more abstraction engine computers 110 which may perform abstraction processes such as those described below. The abstraction engine computer 110 may be in communication with one or more databases 120 and may be accessible to a user via one or more user interfaces 130. The abstraction engine computer 110 may also be in communication with one or more networks 150 such as the internet or a private network. The abstraction engine computer 110 may be able to communicate with other computers 140 via the network 150. Also, databases 120 and/or user interfaces 130 may be in communication with the abstraction engine computer 110 via the network 150 or directly.

The abstraction engine computer 110 may be used to generate data that may be useful in the construction of building elements. A construction design model may serve as a file input. This model may be the starting point for a process where construction documents, building system (HVAC, plumbing, electrical) documents, and material cost and inventory requirements are produced in preparation for a physical build. Information in the digital model may be abstracted to derive information and controls for fabricating the physical structure. An automated or semi-automated process may parse 3D information inherent to digital models to derive CAD instructions which may be used by robotic machinery to manufacture the digitally represented structure. This process may be applicable in fabricating enclosures, bridges, boats, jets, and similar complex systems that may require structural rigidity and a complex form. This process may be compatible with a diverse selection of composite materials and CNC, CAD, robotic, and rapid manufacturing machinery.

Figure 2A:
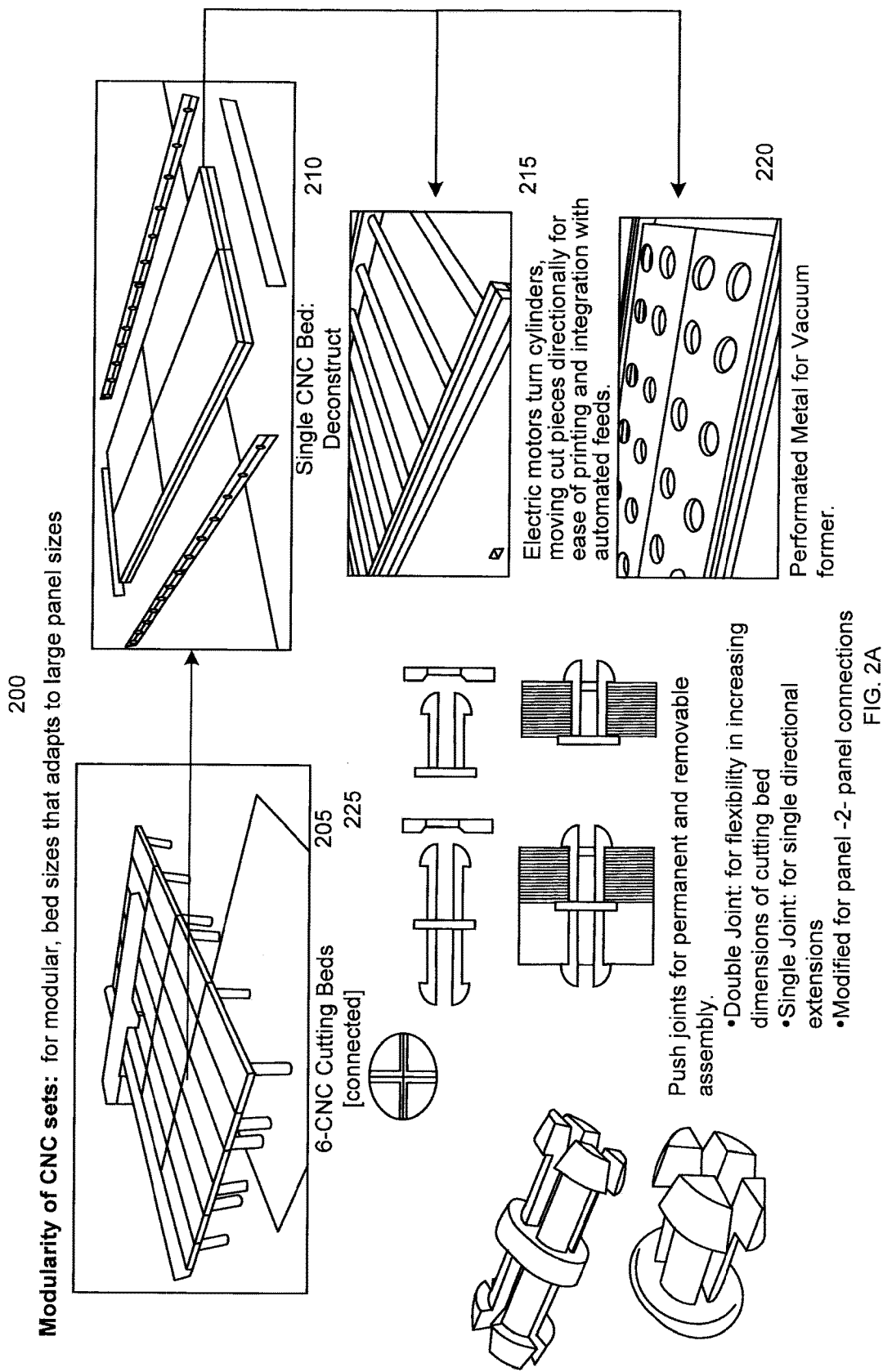
FIG. 2A is a computer numerical control (CNC) system according to an embodiment of the invention.

FIG. 2A depicts a computer numerical control (CNC) system 200 according to an embodiment of the invention. As those of ordinary skill in the art will appreciate, a CNC system may include a computer and a tool element which can be used to perform automated construction. This CNC system 200 is presented as an example of a system which may use data generated by the abstraction engine computer 110 to perform construction. A set of CNC cutting beds 205 may be arranged to accommodate construction materials such as panels of various sizes. The set of cutting beds 205 may include one or more single modular CNC beds 210, each of which may include one or more cylinders 215 turned by motors to move materials atop the bed 205. Sides of the cutting beds 205 may include perforated panels 220 which may be fastened to one another with push joints 225, either permanently or temporarily. This example CNC system 200 may be used with the systems and methods described below, although other CNC systems may be used as well.

Figure 2B:
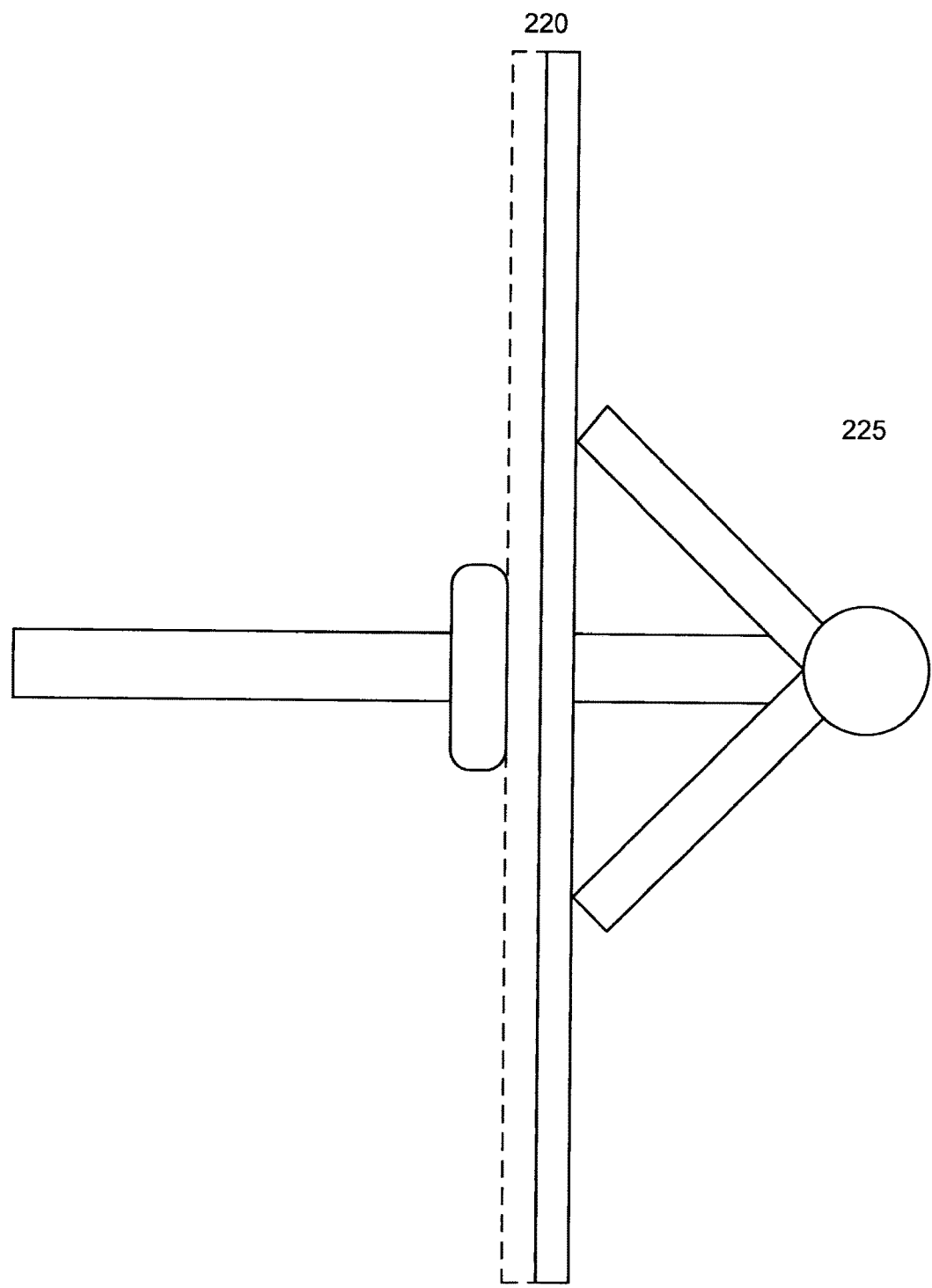
FIG. 2B is a push joint according to an embodiment of the invention.

FIG. 2B is a push joint 225 according to an embodiment of the invention. The push joint 225 may be made of a flexible material, such as a composite material, so that when the push joint 225 is pushed through a hole, such as a hole in a panel 220, the push joint 225 may deform (i.e., bend to its center) in order to pass through the hole. Once through, lips of the push joint 225 may extend and prevent the push joint 225 from deforming and coming out of the hole.

Figure 2C:
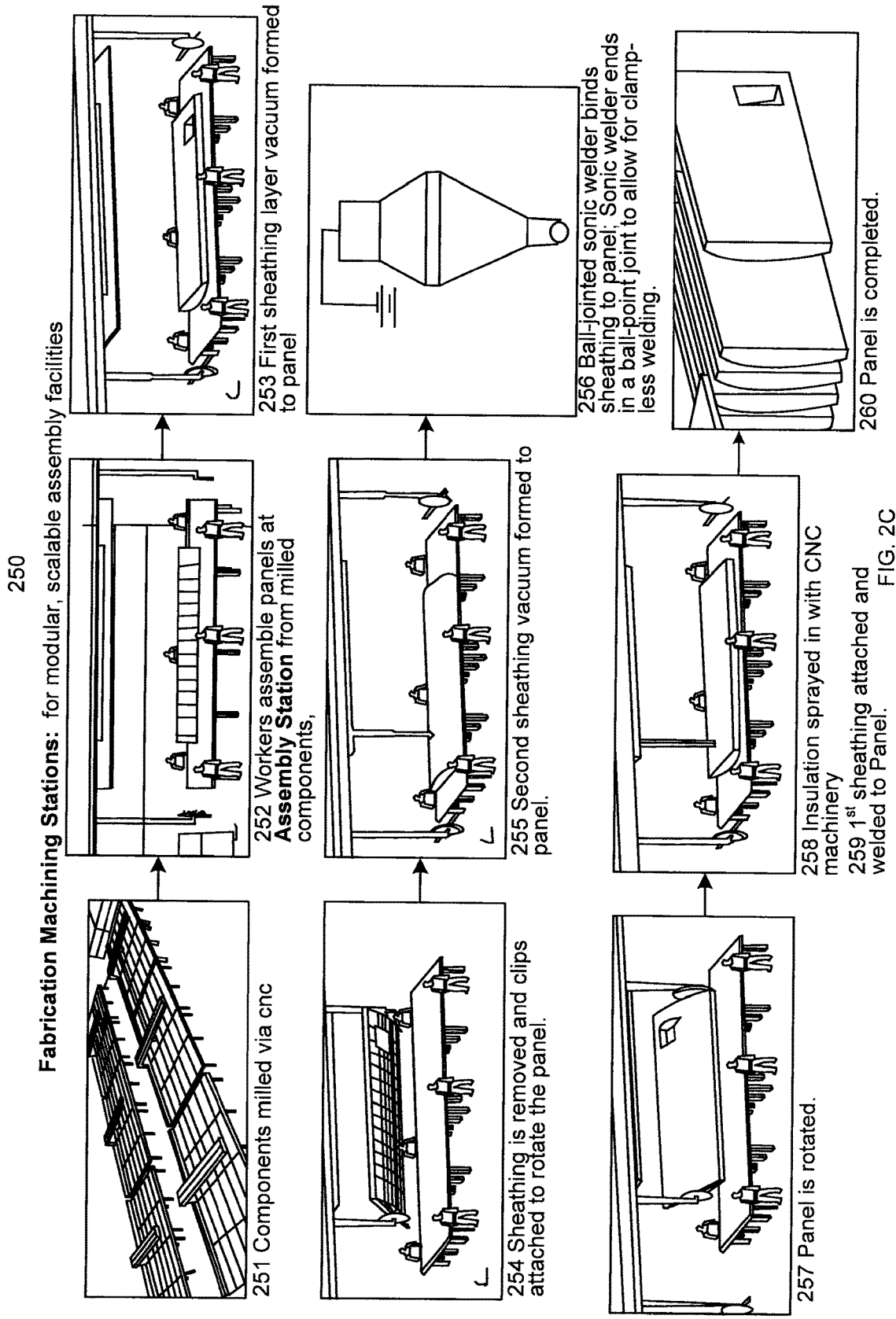
FIG. 2C is a manufacturing process according to an embodiment of the invention.

FIG. 2C is a manufacturing process 250 according to an embodiment of the invention. This manufacturing process 250 may use the CNC system 200 of FIG. 2A or some other CNC system, and is an example of a manufacturing process that may be carried out using the data produced by the systems and methods described herein. Components may be milled using CNC 251, and those milled components may be assembled into panels 252. Workers may assemble the panels as shown in FIG. 2C, or they may be assembled automatically. A first sheathing layer may be vacuum formed or otherwise fitted to a panel 253, and then the sheathing may be removed and the panel may be rotated 254. With some forms of vacuum forming the sheathing may not need to be removed prior to rotating. A second sheathing layer may be vacuum formed or otherwise fitted to the panel 255, and the second sheathing may be bonded to the panel 256. For example, the sheathing may be bonded to the panel 256 with a ball-jointed sonic welder as shown. The panel may be rotated 257, and insulation may be added to the panel 258, for example by spraying. The first sheathing may be bonded to the panel 259. The panel construction may thereby be completed 260, and the panel may be ready for use in construction. As those of ordinary skill in the art will appreciate, this is one example of a manufacturing process 250 which could be enabled using the systems and methods described herein, but other methods or steps may be used as well.

Figure 3:
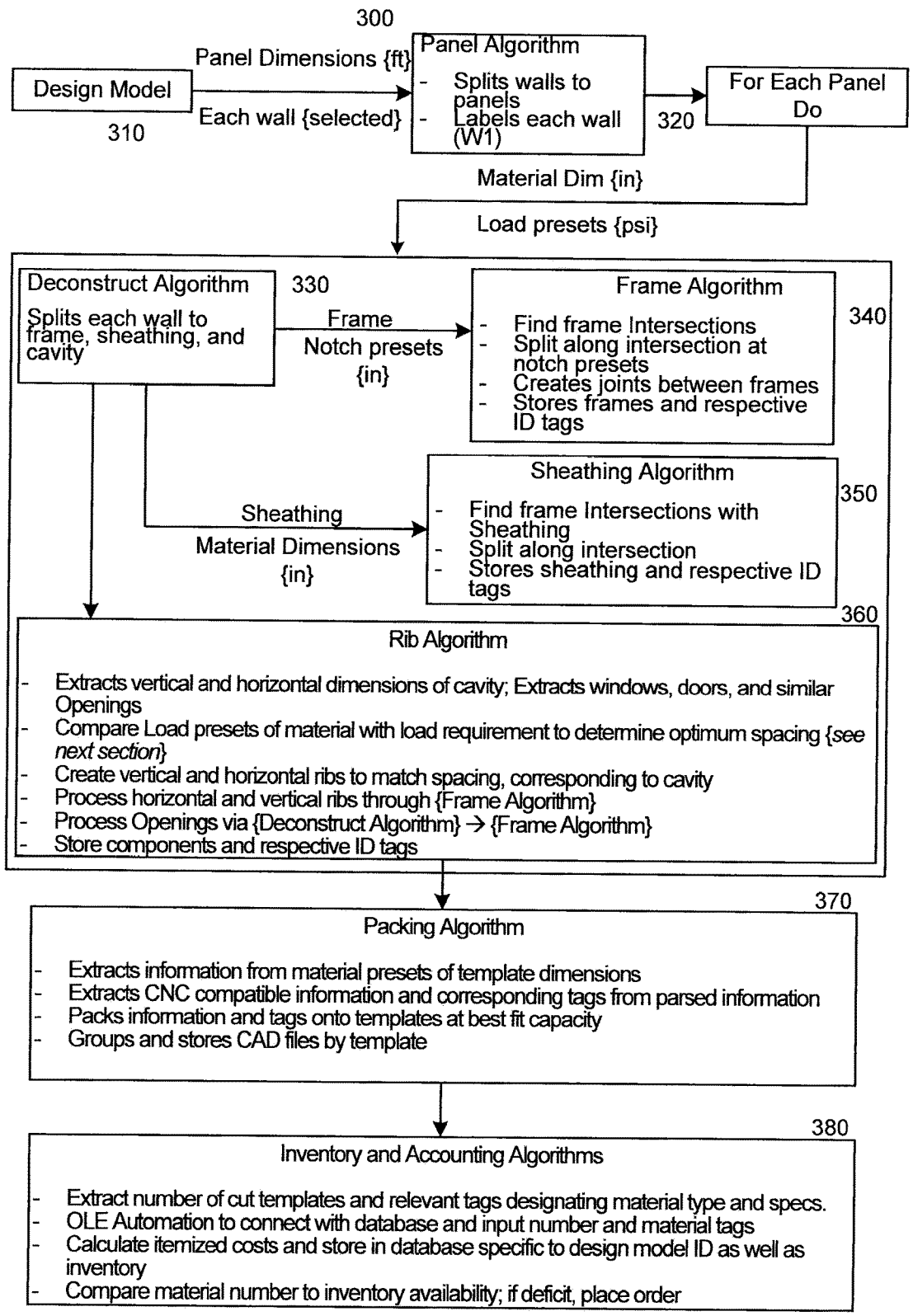
FIG. 3 is a method for generating manufacturing instructions according to an embodiment of the invention.

FIG. 3 is a method for generating manufacturing instructions 300 according to an embodiment of the invention. The abstraction engine computer 110 may use this method 300 to transform a design model into data that may be used by the CNC system 200 and in the manufacturing process 250 described above, for example. The abstraction engine computer 110 may receive a design model 310, which may be a CAD/CAM file or other data. The design model may include, for example, a 3D mockup of a structure with each wall, floor, and roof represented as a closed solid. Toilets, sinks, lighting fixtures, and other uniquely placed building systems may be defined and labeled in the model. The design model may be input by a user via a user interface 130, it may be retrieved from a database 120, or it may be received by the abstraction engine computer 110 in some other way. The abstraction engine computer 110 may apply a panel algorithm 320 to the design model, which may produce one or more panels. The abstraction engine computer 110 may apply a deconstruct algorithm 330 to each panel, which may split the panel into various components. The abstraction engine computer 110 may then apply a frame algorithm 340, a sheathing algorithm 350, and/or a rib algorithm 360 to the deconstructed panel data. When each panel has been analyzed thusly, the abstraction engine computer 110 may apply a subdivide/packing algorithm 370/375 and/or an inventory and accounting algorithm 380 to the data. The result may be a set of data which can be used to facilitate the construction of the panels. The various algorithms used by this method are described in greater detail below with respect to FIGS. 5-11.

Figure 4:
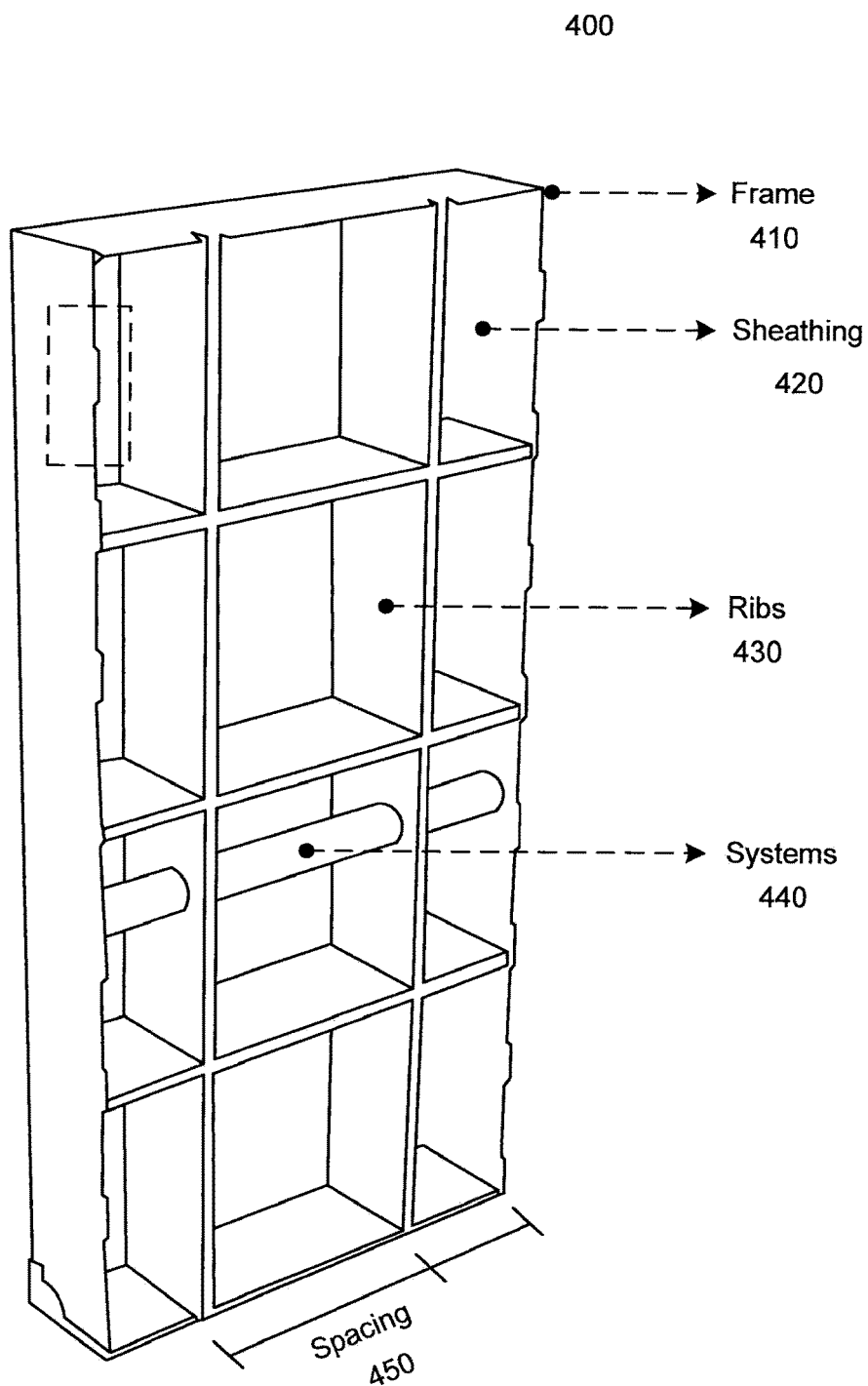
FIG. 4 is a design model according to an embodiment of the invention.

FIG. 4 is a design model 400 according to an embodiment of the invention. A design model 400 may include a 3D model made of solids. The solids may be referred to as blocks. Wall, floor, and roof segments may be represented as distinct closed solids. This example design model 400 is a model of a wall section, although other types of structures or objects may be modeled. The model 400 of FIG. 4 includes a frame 410, sheathing 420, ribs 430, a conduit for systems 440, and spacing 450 between these elements. The design model 400 may be of various formats, for example any CAD/CAM file type. As will be described in greater detail below, the abstraction engine computer 110 may analyze the model 400 and generate instructions for building it.

Figure 5:
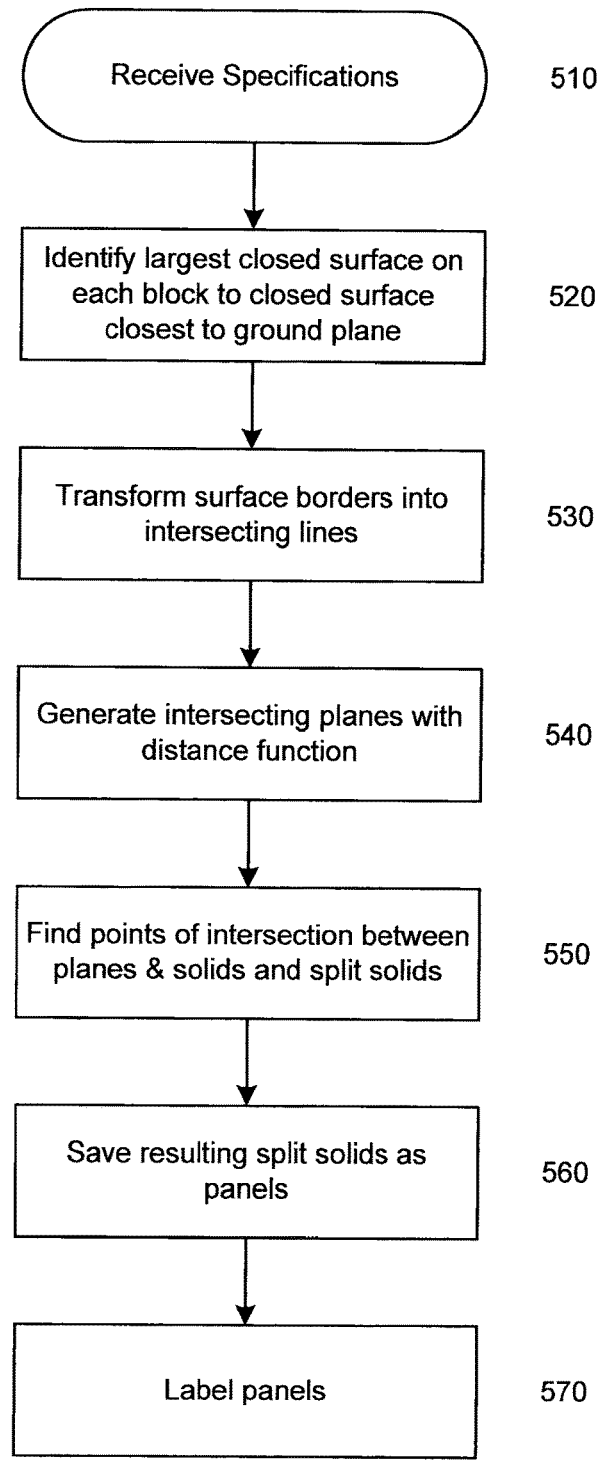
FIG. 5 is a panel algorithm according to an embodiment of the invention.

FIG. 5 is a panel algorithm 320 according to an embodiment of the invention. The abstraction engine computer 110 may receive specifications 510. Specifications may be input by a user via a user interface 130, retrieved from a saved file in a database 120, or input in some other way. The specifications may include material specs, panel sizes, and frame thickness according to performance objectives, for example. The abstraction engine computer 110 may select a largest closed surface on each block and the closed surface closest to the ground plane 520. The abstraction engine computer 110 may abstract the borders of these surfaces, and transform the borders into intersecting lines 530. Abstracting the borders may include pulling the 3D points that correspond to the contour of a shape (and any holes in the shape) and transforming these points into two-dimensional (2D) line/curve, for example a 2D abstraction of a 3D surface similar to how one would hand draw geometry. The edges or vertices may be identified by analyzing for abrupt (hard-degree) shifts in line direction, and the contoured lines may be broken up. For example, a rectangular wall surface may be represented by a rectangular line drawing. The vertices/edges may be identified by where the line slope changes by 90 degrees. The rectangle may be divided into 4 separate lines that intersect at edges/vertices. The abstraction engine computer 110 may select a largest line parallel to the ground plane and a second line (the $3^{rd}$ largest) perpendicular to the ground plan. This process may be repeated for all blocks in a panel. Intersecting planes may be generated at specified intervals in the blocks 540. This may be performed with a distance function. For example, distance (a, b, c zn) may be a function which may be designed to accept inputs (in some embodiments, up to 10 inputs) used to characterize a line or curve and/or its derived surface or solid. In this case it may generate intersecting planes at specified intervals. First, the distance function may measure the length of a line. The distance function may find a point on the line at a distance equal to the panel size from a start point. Directionality may be determined by a mathematical proof that conveys the following mathematical principles. At an arbitrarily far distance from a line, curve, series of planes, series of points, or collection of solids of any geometric form or configuration, a point in (XYZ) space is placed. The distance from this point to any point on the line, curve, free floating point, or centroid point in planes or solids, may be such that all points may be ordered with directionality away from the initial specified point. This means that with an arbitrarily drawn line or curve, all points can be ordered with a defined start and end point in a general direction of movement. With all lines, curves, or points within a given surface or solid, the points may always be ordered such that the start and end points are consistent in their directionality of left to right, bottom to top, or outer to inner. Once this point is located, the distance function may calculate the tangent to a curve at the point, for example with a tangent function. The distance function may generate an intersecting plane perpendicular to the surface with all points passing through the tangent and intersecting the solid. After distances are determined, the abstraction engine computer 110 may split the solids 550. This may be done with a split function that may first find all points of intersection between a plane and a solid and then transform the solid into many solids split at intersection planes with cutting planes. The split solids may be saved 560, for example into a panel array. The panels in the panel array may be labeled 570, for example with a label algorithm. The label algorithm may pull a layername from material attributes of the solid which may have been defined in the input specifications or design model, and may name each panel as a sublayer of a solid, which may be a sublayer of the design model name.

Figure 6:
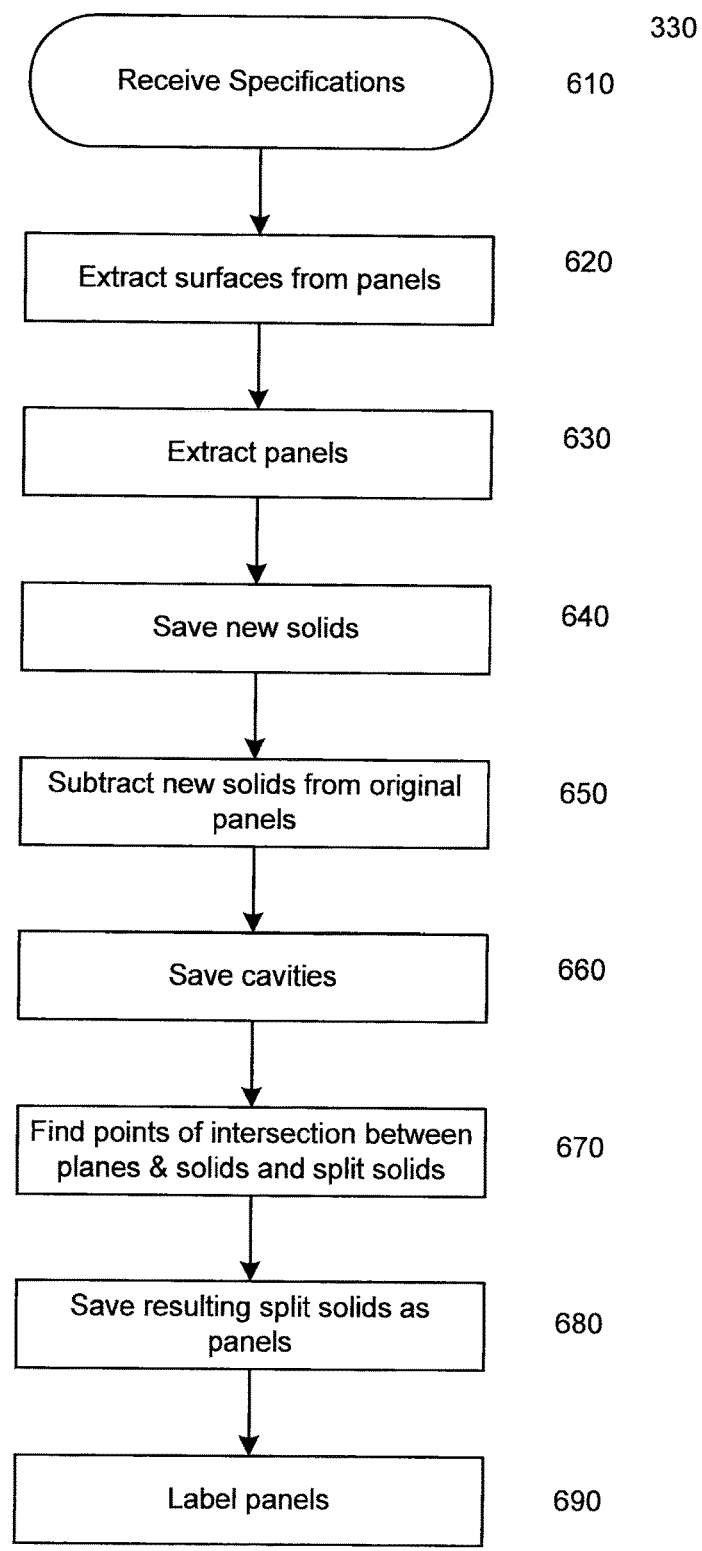
FIG. 6 is a deconstruction algorithm according to an embodiment of the invention.

FIG. 6 is a deconstruction algorithm 330 according to an embodiment of the invention. The abstraction engine computer 110 may execute a deconstruction algorithm 330 to generate component parts of panels created by the panel algorithm 320. The abstraction engine computer 110 may receive specifications 610, such as material specifications, frame thicknesses, and/or sheathing thicknesses that may apply to the design model 400. These specifications may be included in the design model 400, extracted from a database 120, or otherwise input into the abstraction engine computer 110. The abstraction engine computer 110 may extract surfaces from each panel 620 and extrude the surfaces parallel to a normal vector of each surface in the direction of the panel's center moment 630. The extrude distance may be specified as the frame and sheathing thickness from the specifications. Each new solid may be saved into arrays, for example arrSheathing[A] and arrFrames[B] 640. The saved new solids may be subtracted from original panels 650. This may produce new solids which may be saved to array, such as arrCavity for example. A subtract function may be used to subtract the intersecting points between two solids. The subtract function may have the following outputs:

[Objects have zero intersecting points] The original solids without transformations

[Objects intersect at point or line] The original solids without transformations.

[Objects intersect at closed plane] Solids equal to the number of plane intersections split along planes.

[Objects intersect at closed surfaces] Generate an intersecting plane perpendicular to surface, with all points passing through tangent and intersecting the solid.

If the solids intersect in the form of a closed surface or solid, then the objects may be split along the closed surface or solid 670. A split function may first find all points of intersection between a plane and a solid, and then may transform the solid into many solids split at intersection planes with cutting planes. The split solids may be saved 680, for example into a panel array. The panels in the panel array may be labeled 690, for example with a label algorithm. The label algorithm may pull a layername from material attributes of the solid which may have been defined in the input specifications or design model, and may name each panel as a sublayer of a solid, which may be a sublayer of the design model name.

Figure 7:
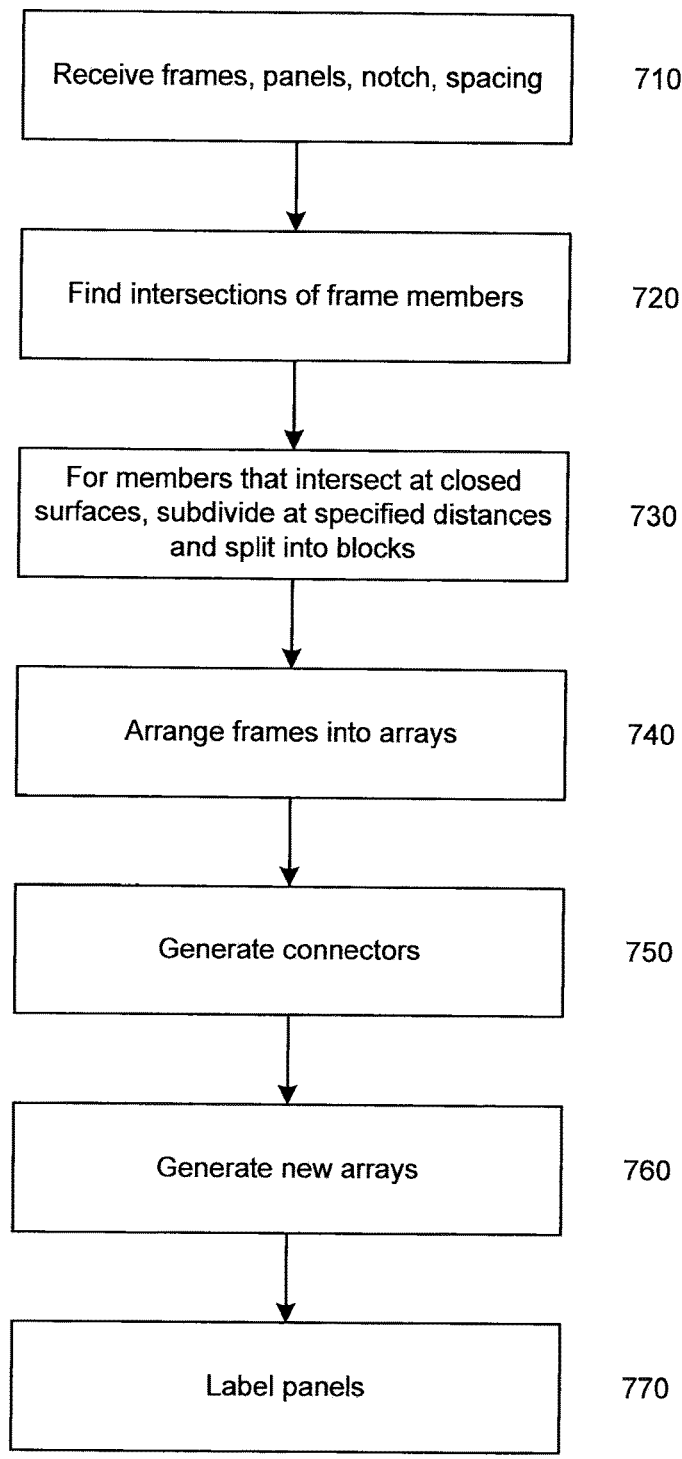
FIG. 7 is a frame algorithm according to an embodiment of the invention.

FIG. 7 is a frame algorithm 340 according to an embodiment of the invention. The abstraction engine computer 110 may execute a frame algorithm 340 to generate frames for panels generated as described above. The abstraction engine computer 110 may receive an array of frames comprising panels, notch (length), and/or spacing(length) 710. The notch and spacing lengths may be included in the design model 400, extracted from a database 120, or otherwise input into the abstraction engine computer 110. The abstraction engine computer 110 may find intersections of all frame members 720. The abstraction engine computer 110 may use an intersect function to find the intersections. The intersect function may have the following outputs:

[Objects have zero intersecting points] Array [null, 0)

[Objects intersect at line] Array [The line, 1)

[Objects intersect at closed plane] Array [The plane, 2)

[Objects intersect at closed surfaces] Array [the Object, 3)

For objects that intersect at closed surfaces, the abstraction engine computer 110 may find joints 730. This may be done, for example, with a joint function which may take an object, subdivide it at specified distances, and split the object into blocks. The joint function may be used to produce these results by receiving cut plane distances determined through application of a distance function (such as that described above with respect to FIG. 5), generating blocks through application of a split function (such as that described above with respect to FIG. 5), and subtracting the blocks from the frames. The frames may be stored into arrays 740, for example arrVerticalFrames and arrHorizontalFrames arrays. The abstraction engine computer 110 may subtract joint blocks from arrVerticalFrames to generate connectors 750 and may subtract arrHorozontalFrames from arrVerticalFrames to generate new arrays 760. The frames may be labeled and placed in an array with coded labels to enable construction 770.

Figure 8A:
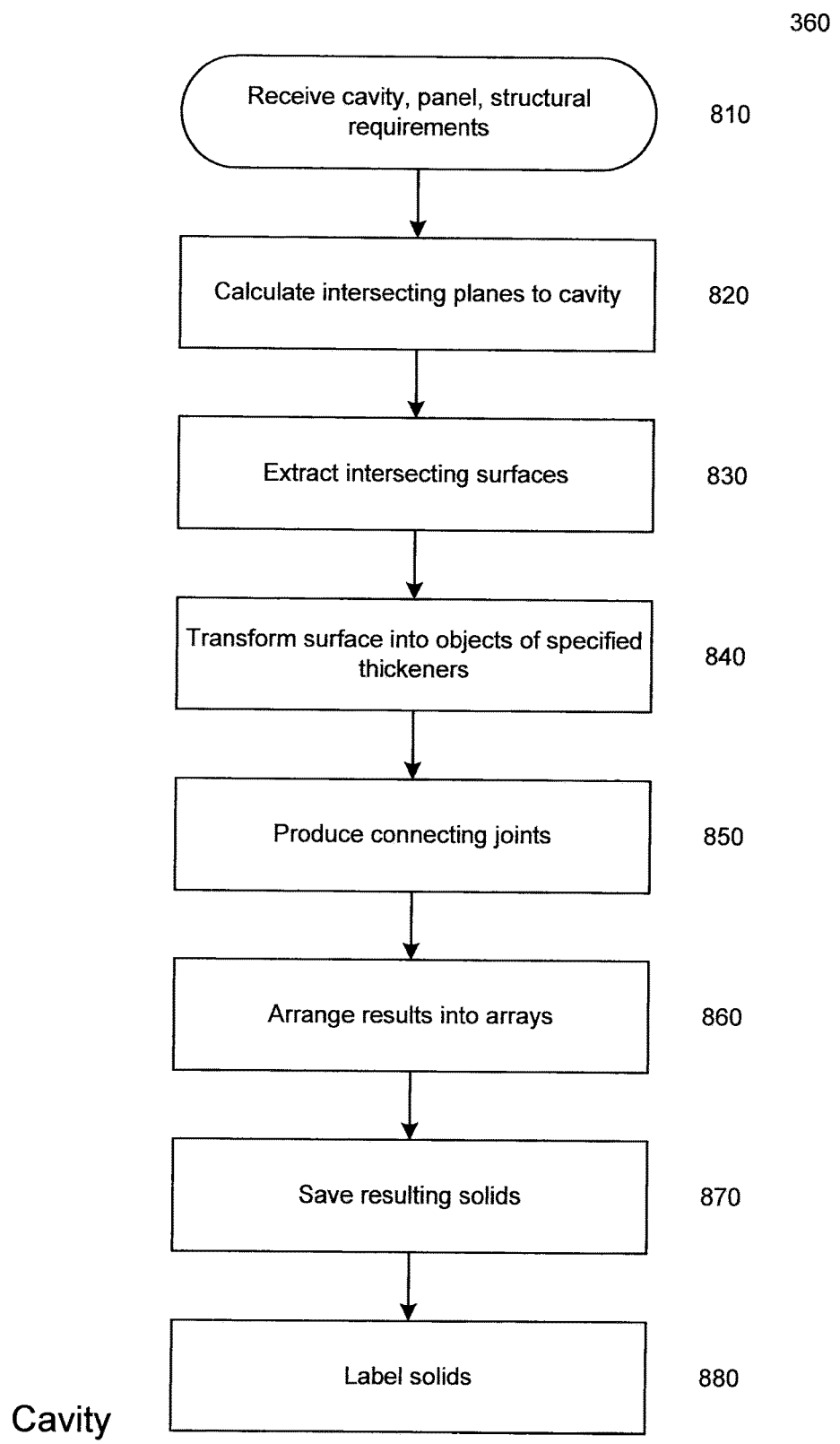
FIG. 8A is a rib generating algorithm according to an embodiment of the invention.
Figure 8B:
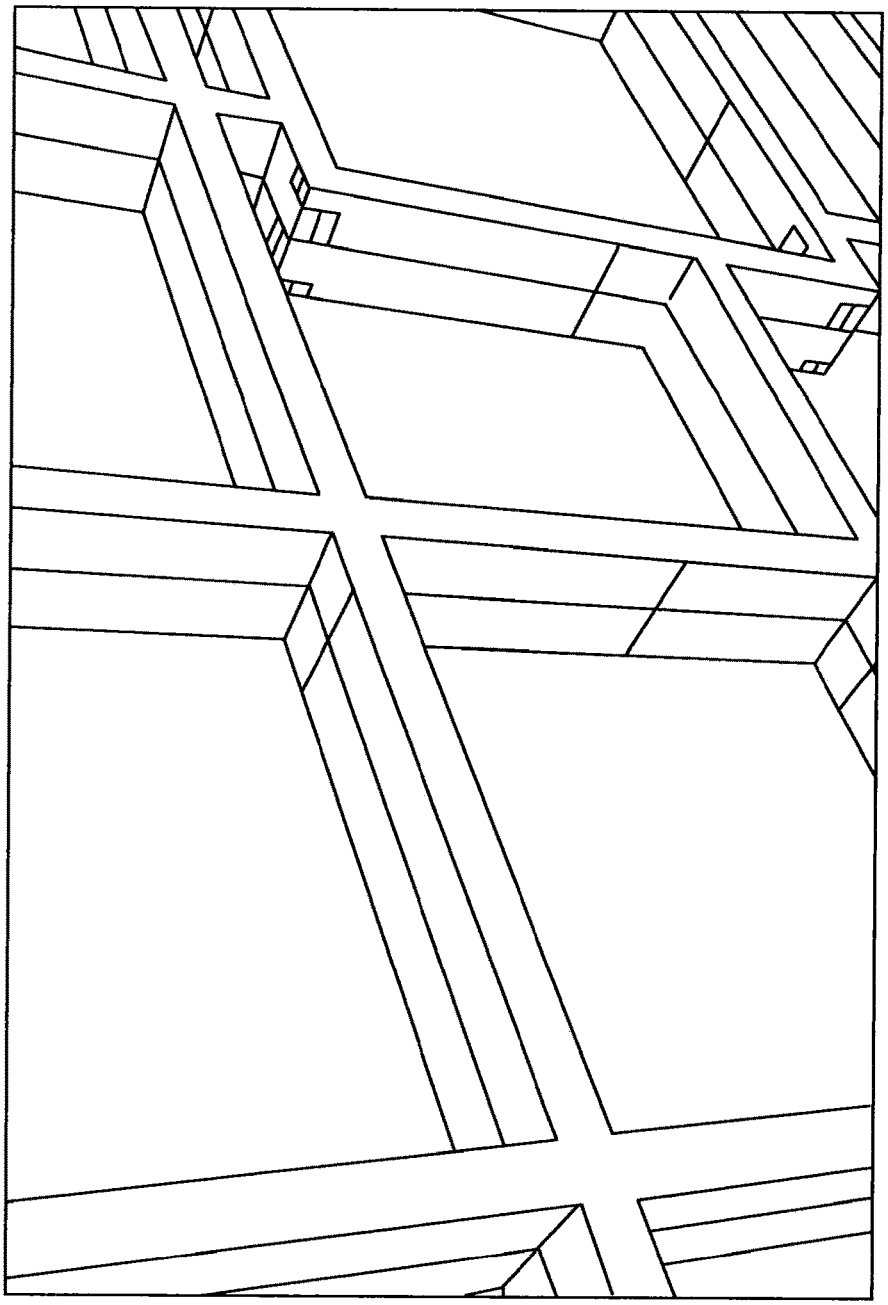
FIG. 8B is a design model according to an embodiment of the invention.
Figure 8C:
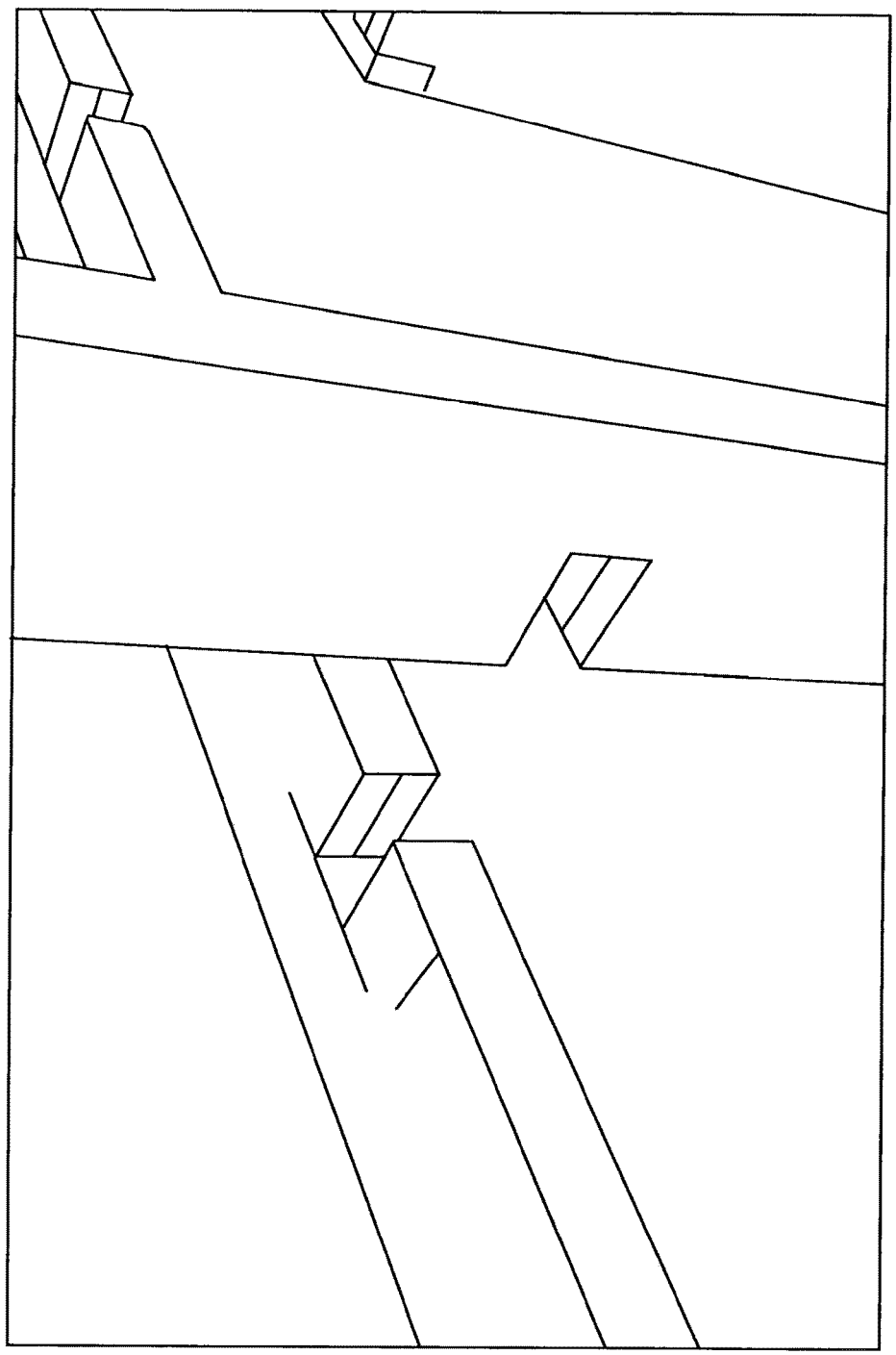
FIG. 8C is a design model according to an embodiment of the invention.

FIG. 8A is an algorithm 360 for generating the structural ribs that take and redistribute compression load and impact load from wind, for example, according to an embodiment of the invention. The abstraction engine computer 110 may execute a cavity algorithm 340 to extrude panels. The frame algorithm 340 may create a cavity that serves as the input for this algorithm 350. Algorithm 350 may abstract the cavity into a lattice of ribs of thickness determined by a combination of a load per square foot to be supported and an intrinsic compression and tensile strength of the materials used as specified by user input or the database 120. This rib structure may give the panels the ability to conform to near any geometric shape, and may provide an elastic resistance to compression loads, wind loads, and earthquake events. The abstraction engine computer 110 may receive a panel and cavity data and structural requirements 810. The structural requirements may be included in the design model 400, extracted from a database 120, or otherwise input into the abstraction engine computer 110. The panel and cavity data may have been generated using the panel algorithm 320 and deconstruction algorithm 330 described above. The abstraction engine computer 110 may calculate intersecting planes to the cavity in an X and Y direction corresponding to the structural requirements 820. The abstraction engine computer 110 may use the intersecting planes and the cavity to extract the intersecting surfaces 830. The abstraction engine computer 110 may transform surfaces into objects of specified thickness 840. This may be done by applying an extrusion function which may take a distance, a vector direction, and a planar object as inputs from the panel and cavity data and structural requirements. The abstraction engine computer 110 may convert a planar object into a solid with a Z-value equal to the distance specified and a surface normal parallel to specified. Outputs of the extrusion function may include arrays of new vertical and horizontal objects. The abstraction engine computer 110 may produce connecting joints for the solids 850. The connecting joints may be stored into arrays 860, for example arrVerticalRibs and arrHorizontalRibs arrays. The objects themselves, including the joints, may also be stored into an array 870, for example an arrrRibs(arrVerticalRibs, arrHorozontalRibs) array. The objects may be labeled based on material attributes 880. The labels may include numerical codes. FIGS. 8B and 8C depict example ribs which may be generated with the process of FIG. 8A.

Figure 9:
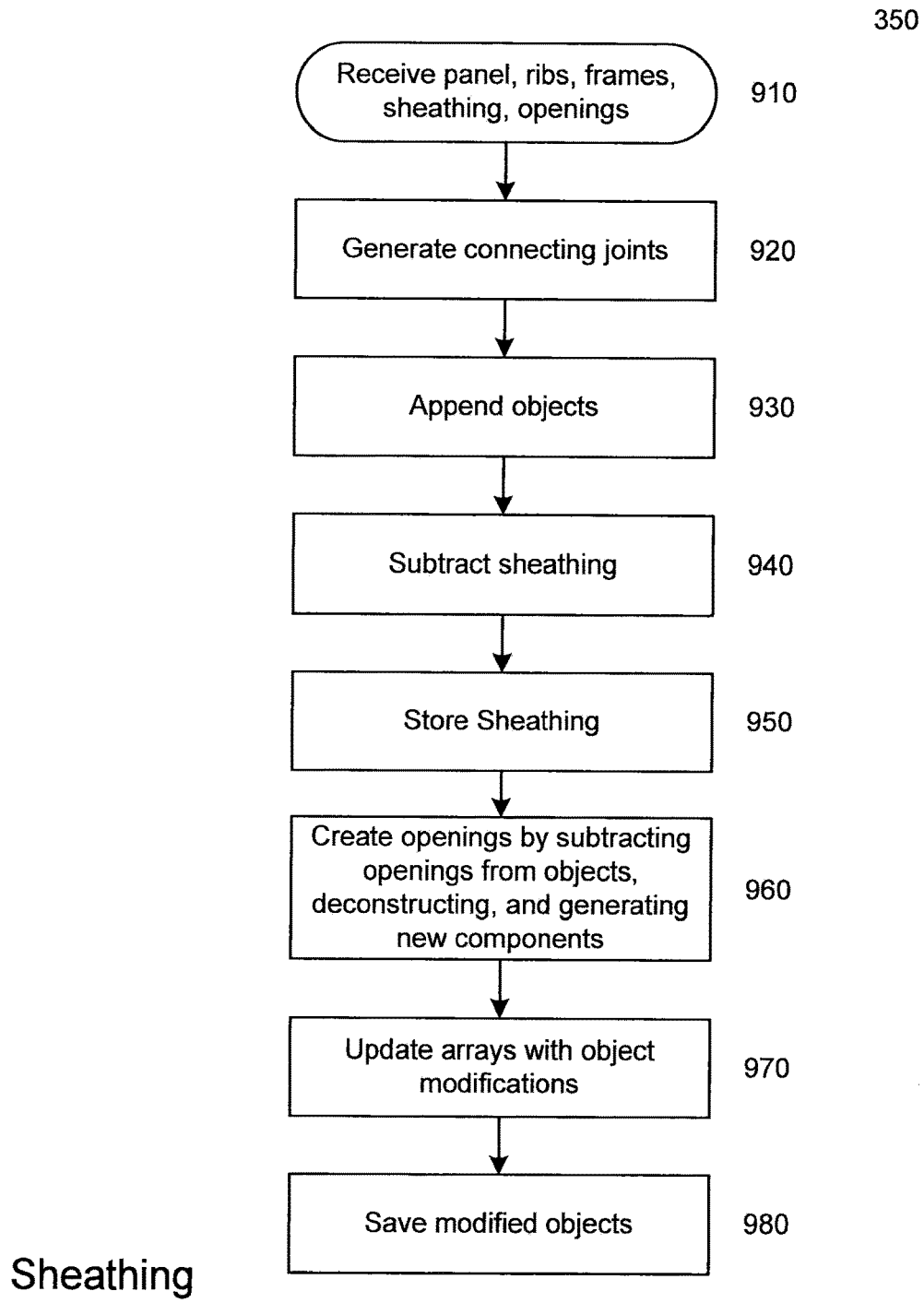
FIG. 9 is a sheathing algorithm according to an embodiment of the invention.

FIG. 9 is a sheathing algorithm 350 according to an embodiment of the invention. The abstraction engine computer, 110 may execute a sheathing algorithm 350 to generate sheathing. The abstraction engine computer 110 may receive panel, rib, frame, sheathing, and opening (such as door and window) data 910. The sheathing and opening data may be included in the design model 400, extracted from a database 120, or otherwise input into the abstraction engine computer 110. The panel, rib, and frame data may be generated by the algorithms described above. Connecting joints between objects may be generated 920, for example by using a process described above with respect to FIG. 7. Ribs and frames generated as described above may be appended to objects 930, and sheathing may be subtracted from the objects 940. The subtracted sheathing may be stored 950, for example in an array. Openings may be created in the objects 960. This may be done by applying an opening function to the objects, which may be able to create openings of any geometry in structure, and may integrate the openings with existing components. First, openings may be subtracted from existing objects. A deconstruction algorithm such as that described above with respect to FIG. 6 may modify the objects by creating components if needed, deleting the sheathing component, and storing the remaining output. New joints and sheathing may be generated and integrated with the previously existing objects, for example using a joint function such as that described above with respect to FIG. 7. Existing objects may be modified and saved 970, and the arrays may be updated to include new objects with openings 980 if any new components were generated.

Figure 10:
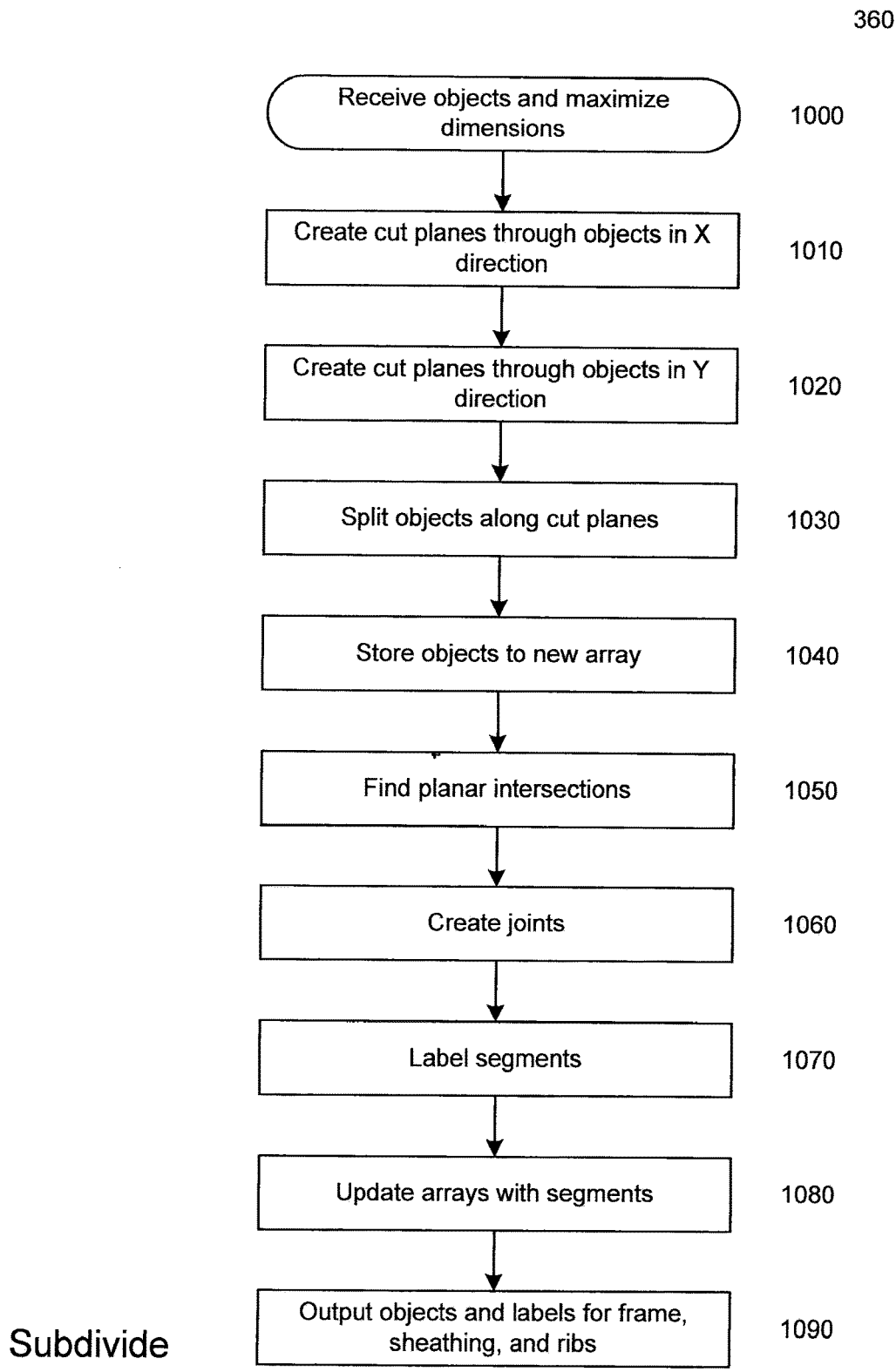
FIG. 10 is a subdivide algorithm according to an embodiment of the invention.

FIG. 10 is a subdivide algorithm 370 according to an embodiment of the invention. The subdivide algorithm 370 may allow the abstraction engine computer 110 to break components down to fit the maximum work area of corresponding fabrication machinery such as the CNC equipment 200 described above. The abstraction engine computer 110 may receive input maximum lengths in the X,Y directions and an array of components 1000. The components may be those generated according to the processes described above. The maximum lengths may be included in the design model 400, input by a user via a user interface 130, retrieved from a saved file in a database 120, or input in some other way. The abstraction engine computer 110 may apply a distance function (such as that described above with respect to FIG. 5) to the objects and the maximum X length to create cutplanes through objects in the X direction 1010. The abstraction engine computer 110 may also apply a distance function to the objects and the maximum Y length to create cutplanes through objects in the Y direction 1020. The abstraction engine computer 110 may use the cutplane data to split objects along cutplanes 1030, for example through application of a split function (such as that described above with respect to FIG. 5). The split objects may be stored in a new array 1040 and labeled, for example with a letter. The abstraction engine computer 110 may find which segments create planar intersections with each other 1050 and create joints between intersecting segments 1060, for example by using the intersection and joint algorithms described above. The segments may be labeled 1070, for example with the letter corresponding to the larger object of which they are a part. Existing objects may be modified and saved 1080, and the arrays may be updated to include the new labeled segments 1090.

Figure 11:
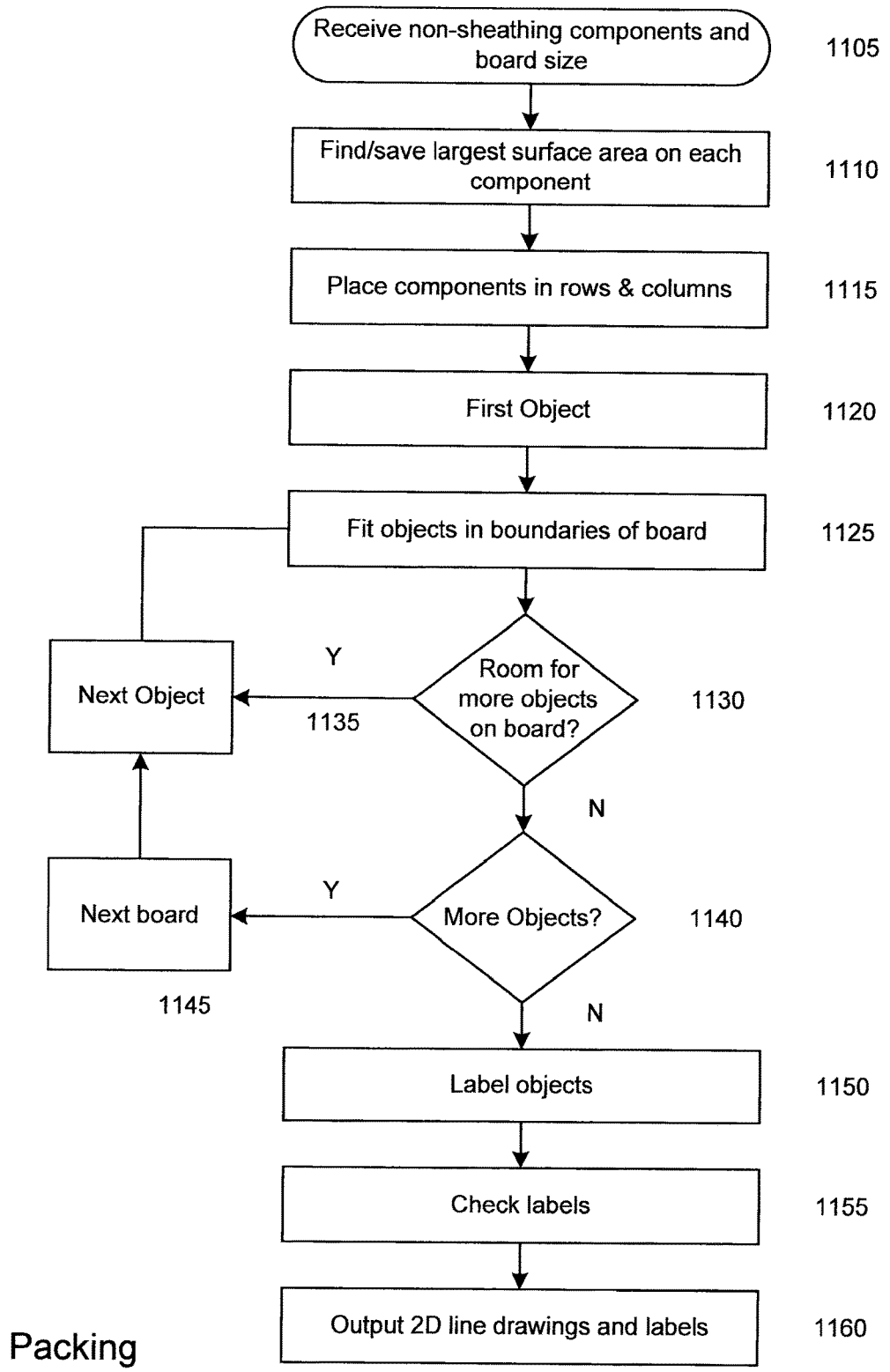
FIG. 11 is a packing algorithm according to an embodiment of the invention.

FIG. 11 is a packing algorithm 375 according to an embodiment of the invention. The packing algorithm 375 may enable efficient cutting of components from boards by CNC equipment 200. The abstraction engine computer 110 may receive data for all components except for sheathing, which may be generated as described above with respect to FIGS. 5-10, as well as a board size 1105. The board size may be included in the design model 400, input by a user via a user interface 130, retrieved from a saved file in a database 120, or input in some other way. The abstraction engine computer 110 may find the largest surface area on each component and save the found area in an array 1110. Components may be dynamically placed on the board 1115. A first object may be selected 1120, and a subtract function such as that described above may be used to see where objects extend outside the boundaries of the board 1130. If an object doesn't fit, the object may be rotated until it does not intersect the board or any other component. The abstraction engine computer 110 may determine if there is room for more objects on a board 1130. If so, the abstraction engine computer 110 may select another object which may fit on the board 1135, position the object on the remaining space on the board not occupied by the first object using the subtract function 1125, and again determine if there is room for more objects on a board 1130. When the board is as full as possible, if more objects remain 1140, a new board template may be generated 1145 and the process may iterate. When all objects have been placed on boards, the abstraction engine computer 110 may define the center point on each surface and place a corresponding label at the point 1150. The labels may be those that were generated in previous steps in making the ribs (cavity algorithm) the frames, sheathing, openings, etc. These labels may be engraved on each piece by CNC so that builders may know when a component is used, what adjacent components it connects with, etc. The labels may be or include text, barcodes and/or RFID chips. The abstraction engine computer 110 may check that the labels do not fall on any holes or cut-aways to ensure readability 1155. If so, text may be moved parallel to the surface plane (X,Y) until this is no longer the case. The abstraction engine computer 110 may output 2D line drawings of the template board, components, and their labels 1160.

Figure 12:
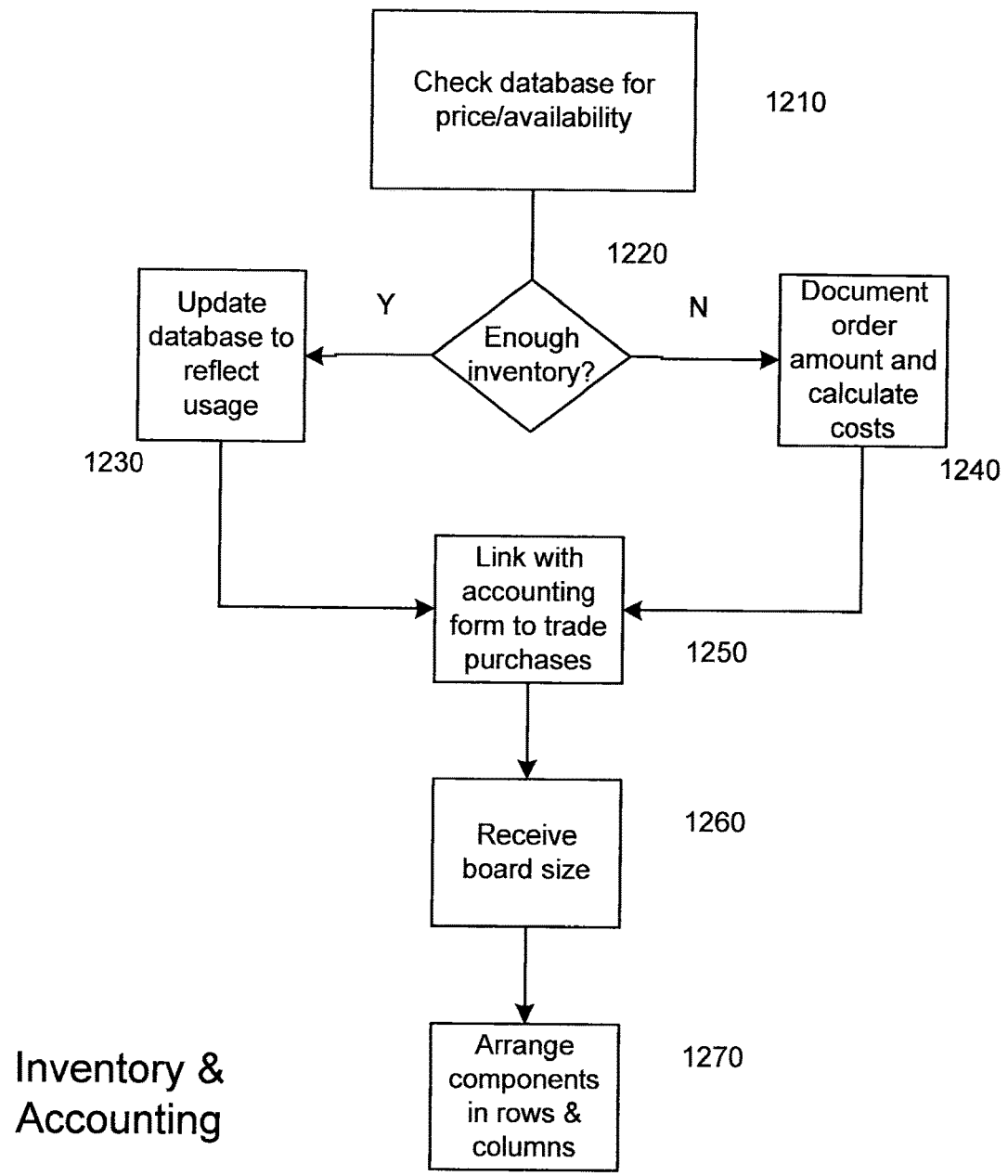
FIG. 12 is an inventory and accounting algorithm according to an embodiment of the invention.

FIG. 12 is an inventory and accounting algorithm 380 according to an embodiment of the invention. When the building components have been generated according to the processes of FIGS. 5-11 above, the abstraction engine computer 110 may locate inventory and/or pricing for the components. Using a stored number of boards and project ID, the abstraction engine computer 110 may check a database 120 that holds the real-time value for the specified material price, availability for purchase, and inventory amount 1210. This may be a local database 120 or it may be a database 120 of a vendor or supplier accessible via a network 150. If enough material exists in inventory, the database 120 may be updated to reflect usage 1230 and remove the material for the project from the database 120. If not enough is available in inventory, a specified order amount may be documented and costs for the order may be calculated 1240. The abstraction engine computer 110 may link with an accounting form to track any purchases connected to the project 1250. Linking between database 120 and the 3D digital environment may be accomplished through object linking and embedding (OLE) automation, C++ processes, and/or XML, for example. The abstraction engine computer 110 may receive a board size specification, for example from the design model 400, from a user via a user interface 130, from a saved file in a database 120, or in some other way. Components may be placed linearly in rows and columns 1270.

Figure 13:
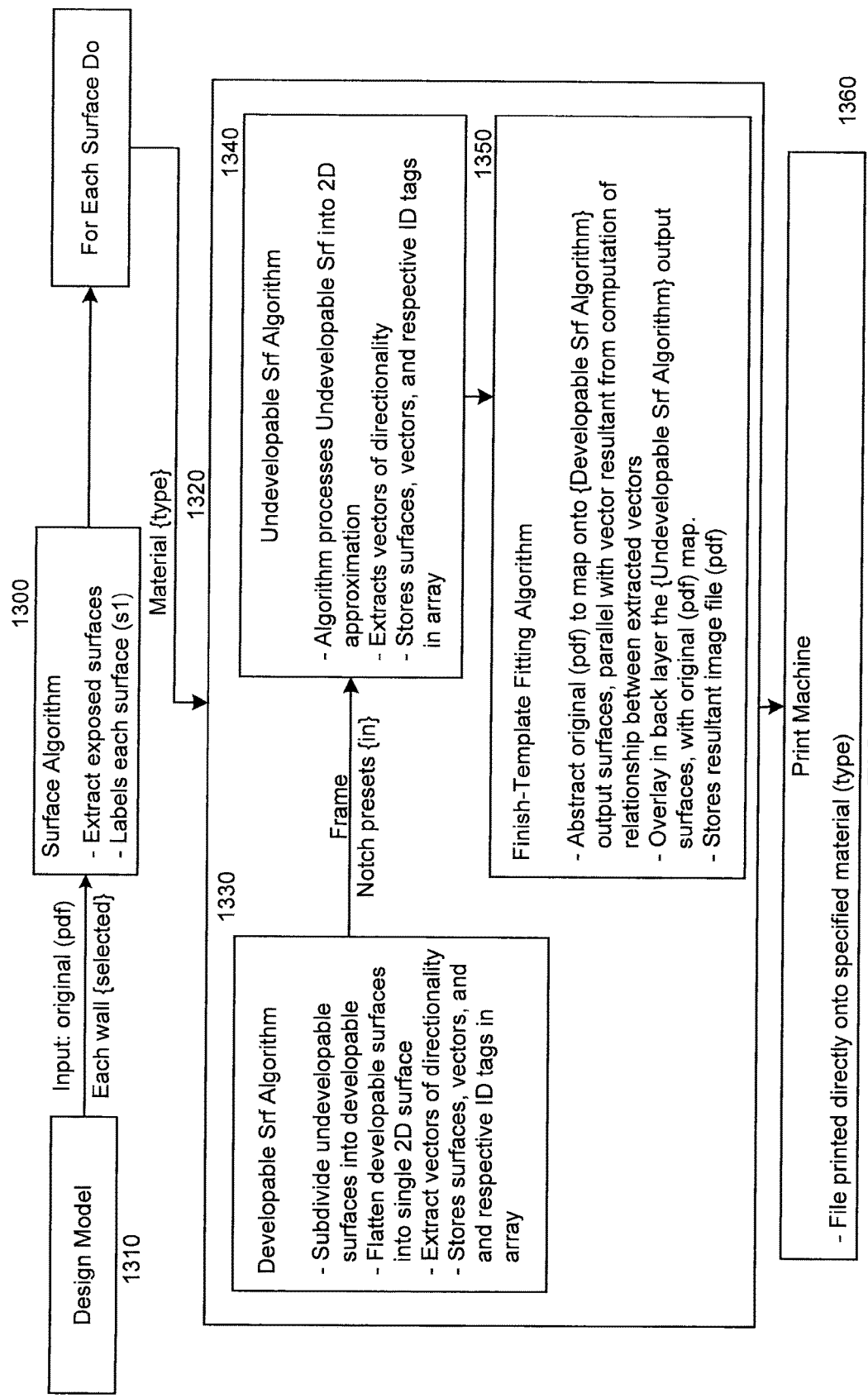
FIG. 13 is a method for generating surface printing instructions according to an embodiment of the invention.

FIG. 13 is a method for generating surface printing instructions 1300 according to an embodiment of the invention. This method 1300 may be used to print surfaces for use in assembling building components. For example, sheathing for parts generated as described above may be designed according to the method 1300 of FIG. 13. The abstraction engine computer 110 may receive a design model 1310, which may be a CAD/CAM file or other data. The design model may be the same design model 400 used in the method 300 described with respect to FIG. 3, in some examples. The design model may be input by a user via a user interface 130, it may be retrieved from a database 120, or it may be received by the abstraction engine computer 110 in some other way. The abstraction engine computer 110 may apply a surface algorithm 1320 to the design model, which may produce one or more surfaces. The abstraction engine computer 110 may apply a developable surface algorithm 1330 and/or undevelopable surface algorithm 1340 to each surface. The abstraction engine computer 110 may then apply a fitting algorithm 1350 to the surface. When each surface has been developed thusly, the result may be input to a print machine which may print the surfaces 1360. The various algorithms used by this method are described in greater detail below with respect to FIGS. 15-18.

Figure 14A:
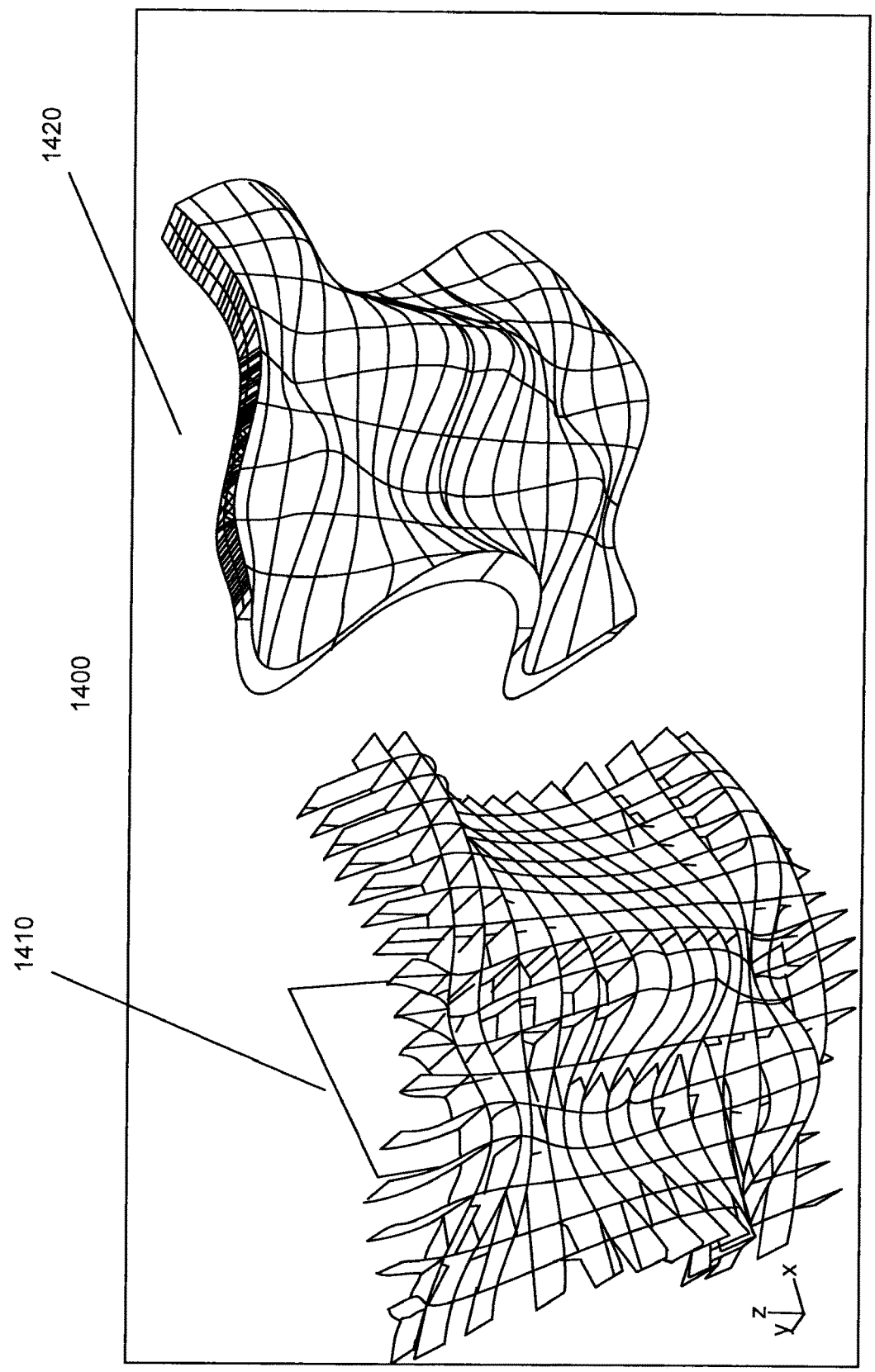
FIG. 14A is a design model according to an embodiment of the invention.

FIG. 14A is a design model 1400 according to an embodiment of the invention. These surfaces may be the sheathing material (the surface that resists scratches, impacts, wind loads, etc., and functions as a building membrane. The print machine may print directly to this surface or onto a thin-film that may be welded (melded) to the sheathing or may have its printed pattern heat transferred onto the sheathing surface. The design model may include surfaces 1420 over a frame 1410.

Figure 14B:
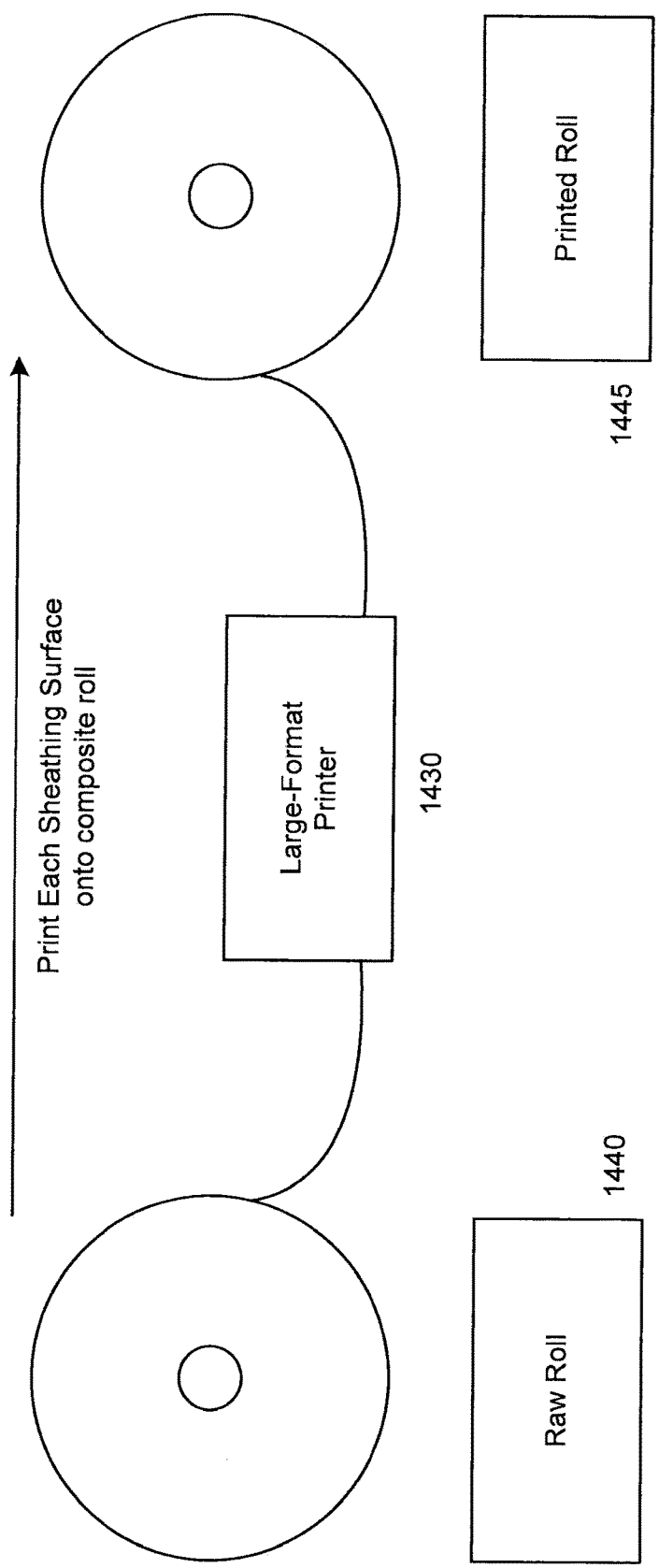
FIG. 14B is a print machine according to an embodiment of the invention.

FIG. 14B is a print machine 1430 according to an embodiment of the invention. The print machine 1430 may be, for example, a large format printer into which the surface data may be fed. The print machine 1430 may print the surface described by the surface data onto a raw roll 1440 of some suitable surface material to produce a printed roll 1445. The surface data produced by the abstraction engine computer 110 may be formatted such that it is suitable for use by the print machine 1430.

Figure 15:
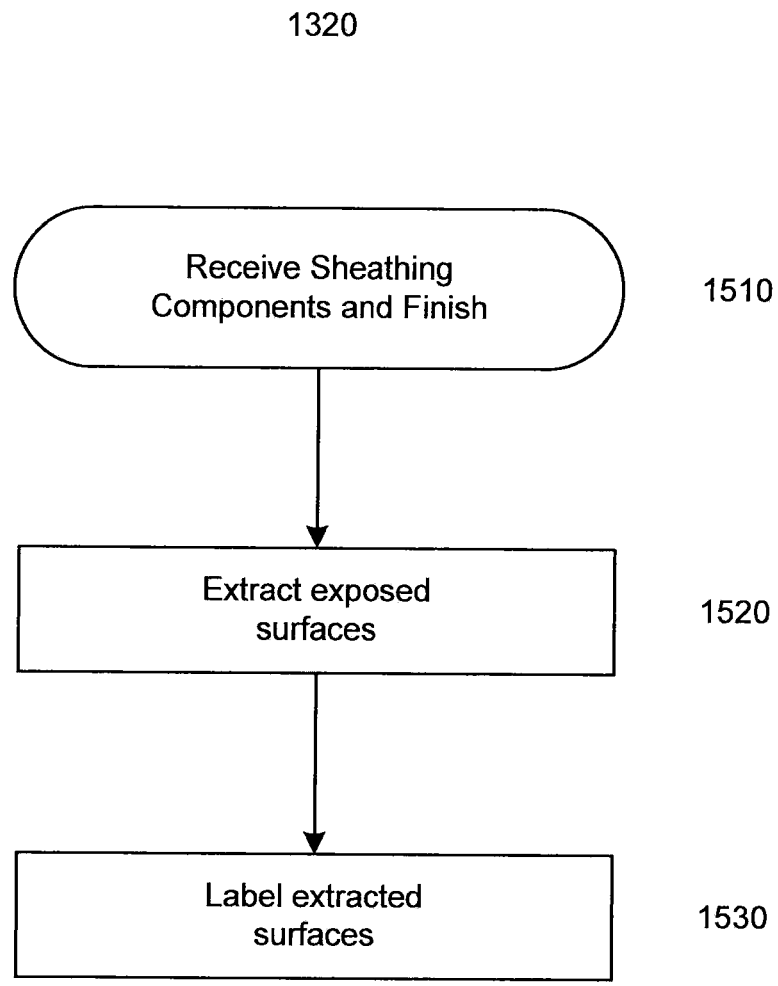
FIG. 15 is a surface algorithm according to an embodiment of the invention.

FIG. 15 is a surface algorithm 1320 according to an embodiment of the invention. The abstraction engine computer 110 may receive sheathing component and finish specifications 1510. Sheathing specifications may be outputted from the 3D to 2D digital abstraction described above with respect to FIGS. 5-13. Finish specifications may be input by a user via a user interface 130, retrieved from a saved file in a database 120, or input in some other way. Finish specifications may be in the form of an image of a desired finish, for example in a .pdf file. The abstraction engine computer 110 may extract exposed surfaces from the sheathing components 1520 and label each surface 1530.

Figure 16:
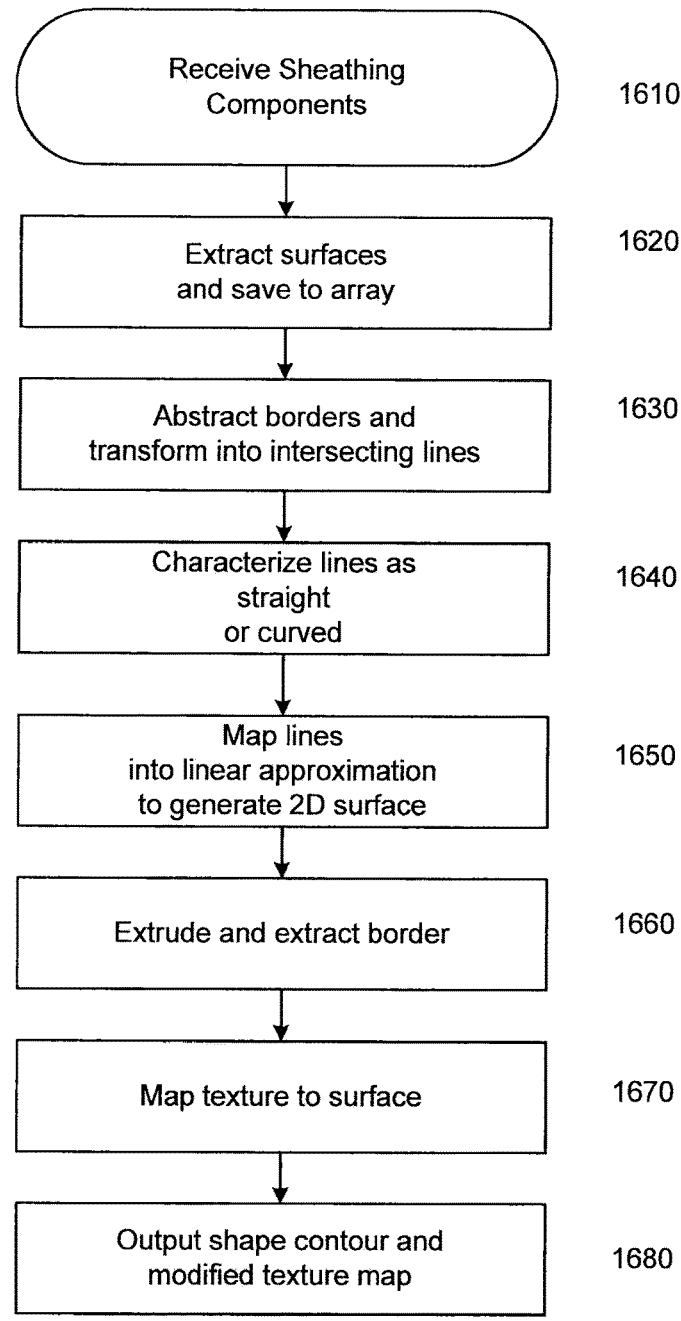
FIG. 16 is a developable surface sheathing algorithm according to an embodiment of the invention.

FIG. 16 is a developable surface sheathing algorithm according to an embodiment of the invention. In mathematics, a developable surface (or torse: archaic) is a surface with zero Gaussian curvature. That is, it is a surface that can be flattened onto a plane without distortion (i.e. stretching or compressing). A developable surface may be a surface which can be made by transforming a plane (i.e. by folding, bending, rolling, cutting, and/or gluing). The abstraction engine computer 110 may receive sheathing specifications 1610, which may have been developed using the surface algorithm 1320. The abstraction engine computer 110 may extract surfaces from the sheathing data and save the surfaces to an array 1620. The abstraction engine computer 110 may abstract the borders of the surfaces and transform them into intersecting lines 1630. The abstraction engine computer 110 may characterize the lines as straight or curved 1640. This may be done, for example, by selecting the largest line and the line perpendicular and characterizing the lines by determining whether [line length]=distance(start-point, end point). If they are equal, the line is straight, otherwise it is curved. The abstraction engine computer 110 may map curved lines into linear approximations at o={A, B}, which may generate a 2D surface 1650. The abstraction engine computer 110 may use an extrude function to turn the shape into a flat 2D surface and extract a border contour 1660. The abstraction engine computer 110 may map the texture to the surface 1670 and output a shape contour (for example as a CAD file) and modified texture map (for example as a .pdf file) 1680.

Figure 17A:
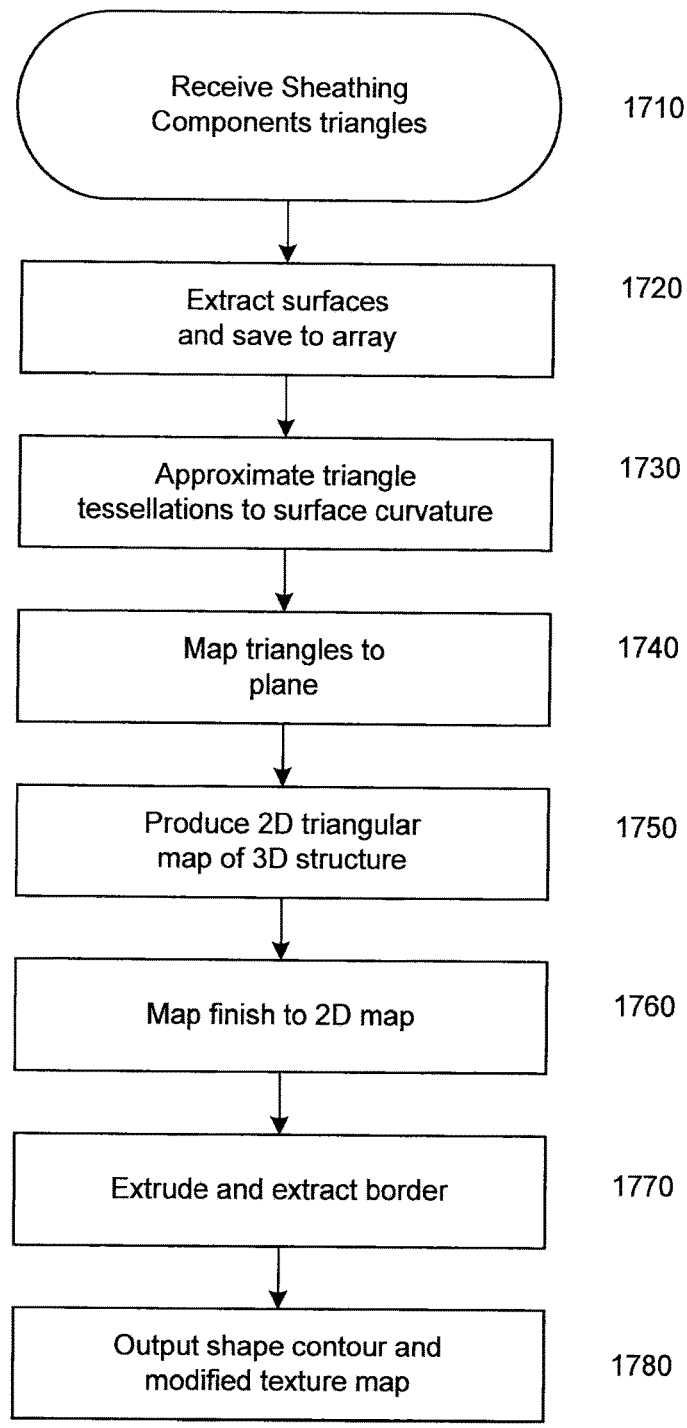
FIG. 17A is an undevelopable surface sheathing algorithm according to an embodiment of the invention.
Figure 17B:
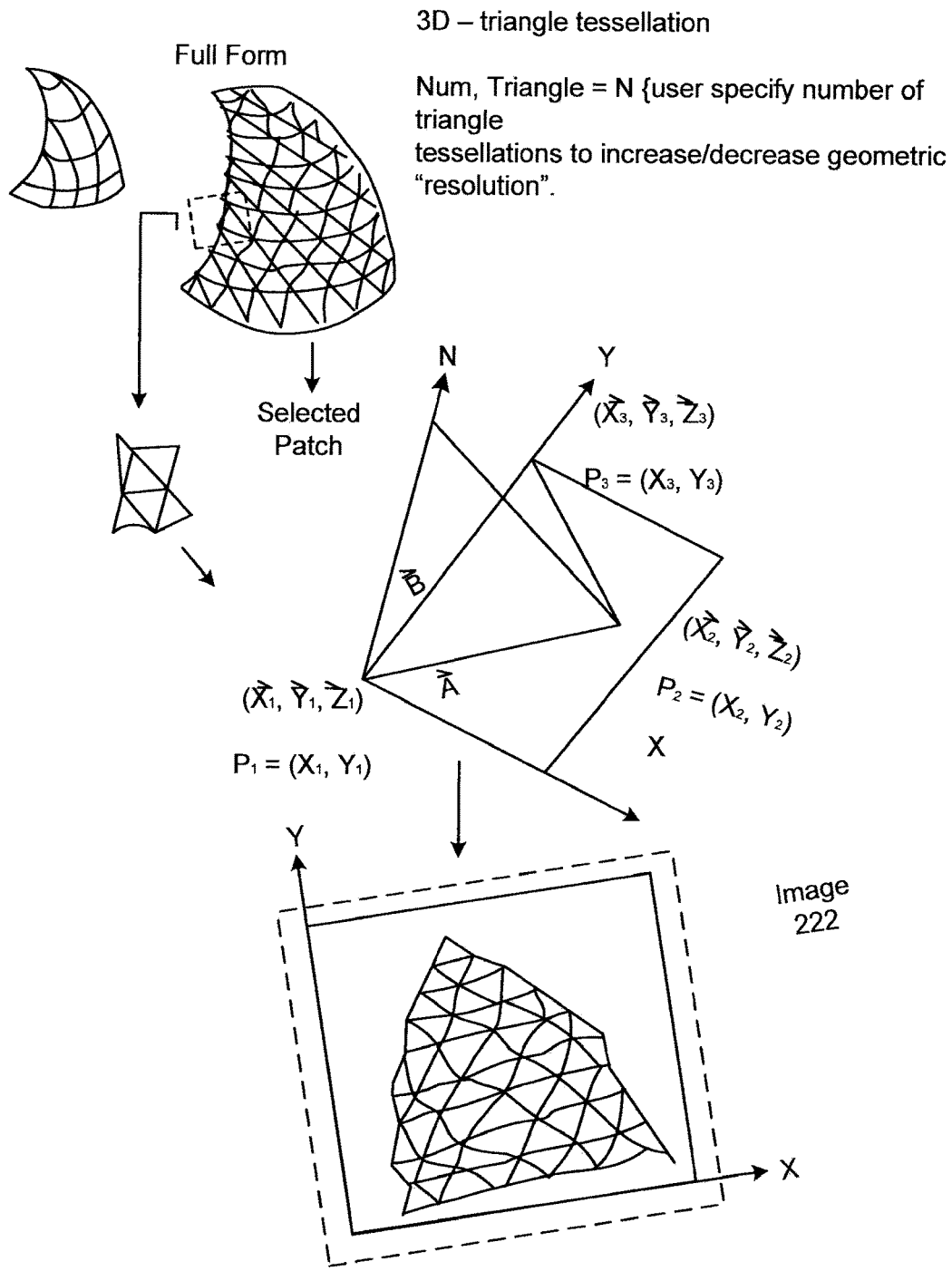
FIG. 17B is an undevelopable surface according to an embodiment of the invention.
Figure 17C:
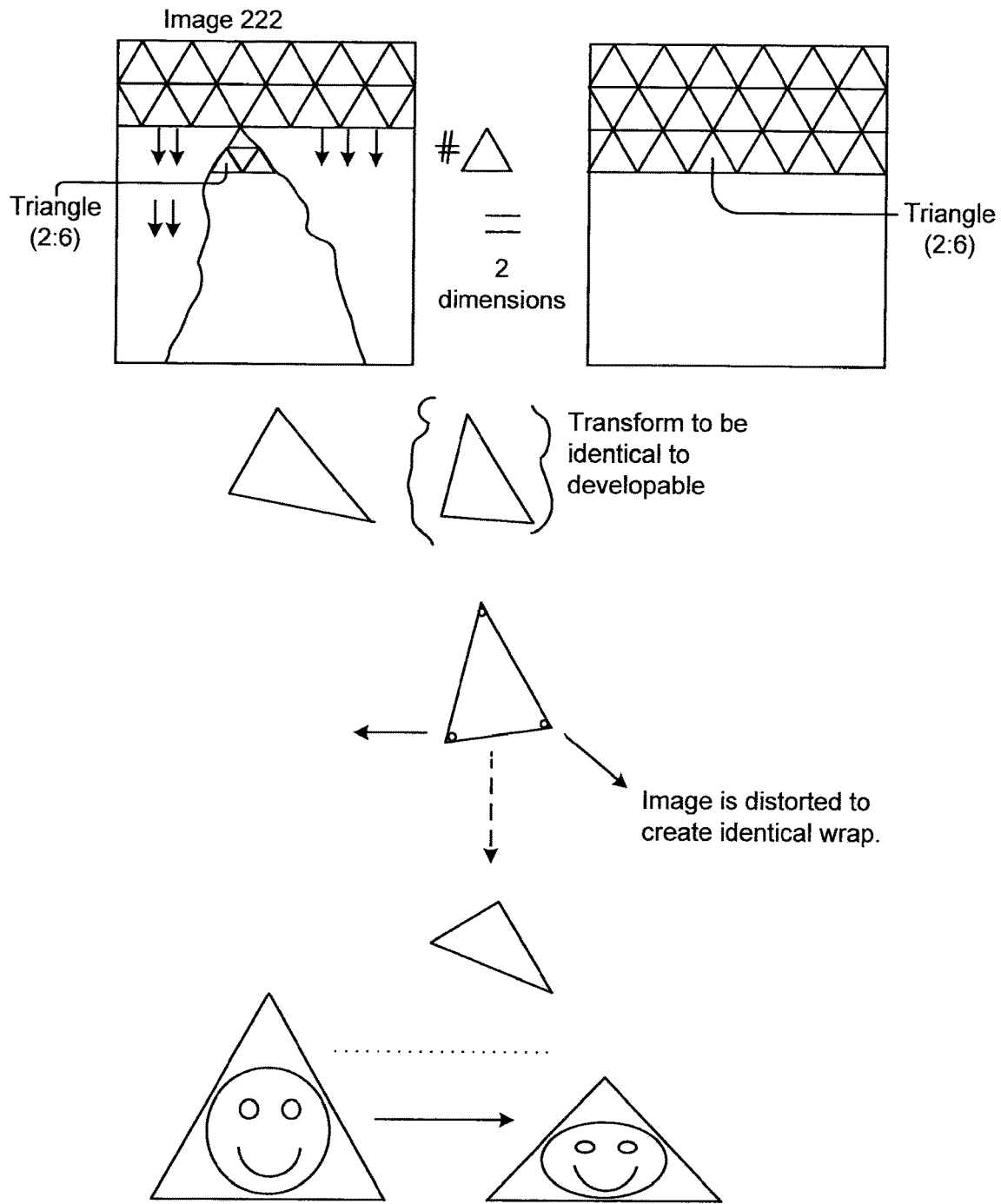
FIG. 17C is an undevelopable surface triangle tessellation according to an embodiment of the invention.

FIG. 17A is an undevelopable surface sheathing algorithm 1330 according to an embodiment of the invention. Undevelopable surfaces may be surfaces which cannot be formed from sheet material without the material shearing in its plane. Surfaces of this type may have curvatures in two different directions (they are therefore often called doubly-curved surfaces). Although these surfaces may be more difficult to manufacture than flat or developable surfaces, their form may give them great stiffness and strength. The abstraction engine computer 110 may receive sheathing specifications, which may have been developed using the surface algorithm 1320, and a triangle selection 1710. The triangle selection may indicate a number of triangles to be used to warp finishing to geometry. Because the surface is not developable, it curves in multiple directions and therefore cannot be abstracted to a flat surface. In order to produce a flat structure, the surface may be approximated by tessellation with triangles. Each individual triangle may be mapped flat such that the vertices of the triangles match with the vertices of connected adjacent triangles that have already been rendered flat. The triangle selection may be input by a user via a user interface 130, it may be retrieved from a database 120, or it may be received by the abstraction engine computer 110 in some other way. The abstraction engine computer 110 may extract surfaces from the sheathing data and save the surfaces to an array 1720. The abstraction engine computer 110 may approximate triangle tessellations to the surface curvature 1730 and map the selected triangles from an r={X,Y,Z} to a o={A, B) plane 1740. The abstraction engine computer 110 may use differential equations to map adjacent triangles to the same plane recursively. The abstraction engine computer 110 may produce a 2D triangular map of the 3D structure 1750 and map the finish image to the shape 1760. The abstraction engine computer 110 may use an extrude function to turn the shape into a flat 2D surface and extract a border contour 1770. The abstraction engine computer 110 may output a shape contour (for example as a CAD file) and modified texture map (for example as a .pdf file) 1780. FIG. 17B illustrates an example of an undevelopable 3D surface translated into a 2D map, and FIG. 17C illustrates an example triangle tessellation.

Figure 18:
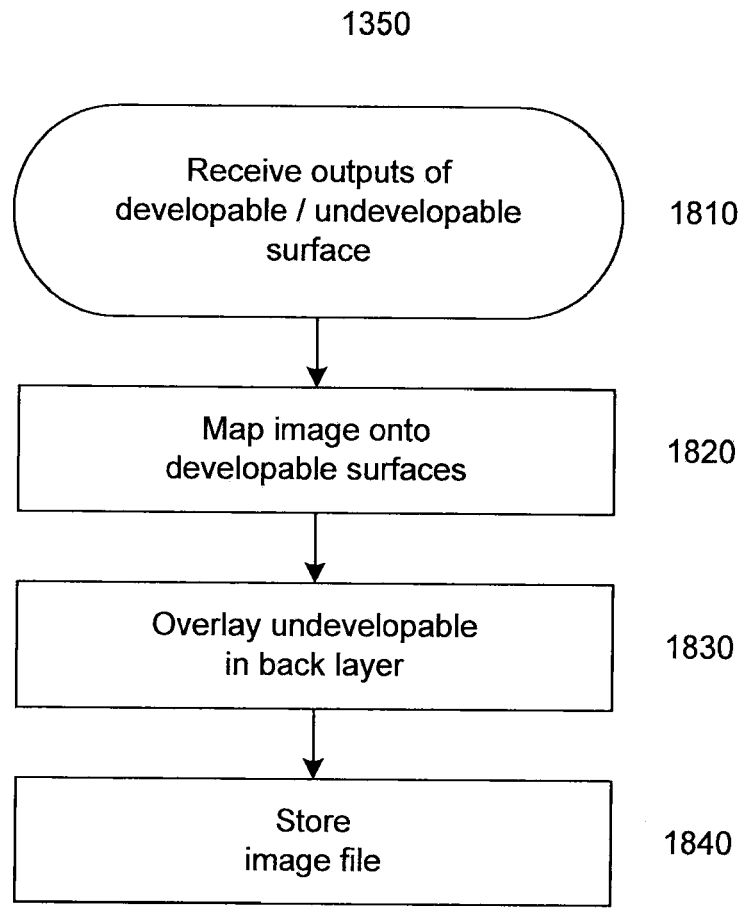
FIG. 18 is a finish template fitting algorithm according to an embodiment of the invention.

FIG. 18 is a finish template fitting algorithm 1350 according to an embodiment of the invention. This algorithm 1350 may be used by the abstraction engine computer 110 to generate an image file which may be used by a print machine 1430. The abstraction engine computer 110 may receive the outputs of the developable surface algorithm 1330 and undevelopable surface algorithm 1340, for example by retrieving them from the arrays in which they were saved 1810. The abstraction engine computer 110 may abstract the sheathing image onto the developable surface algorithm 1330 output 1820. This mapping may be parallel with the vector resultant from computation of relationship between extracted vectors. This means that the image file may be fitted to the tessellations. The image of the undevelopable surface flattened may have a background tessellation added for flat surfaces. The surface texture image may also be tessellated with the same pattern such that the number of triangles on the texture map and those on the surface are equal. For all triangles on the texture map that are identical in shape/size to those on the flattened system, no transformations are applied. For those triangles on the texture map that are of different shape/size to those on the flattened system, the texture map's triangle may be stretched or otherwise distorted such that the vertices fall on identical coordinate points as in the flattened image. Because of this stretching, the texture map's image is also distorted. The abstraction engine computer 110 may overlay in back layer the undevelopable surface algorithm 1340 output 1830. The image file may be regenerated with the distortions applied and with the triangle pattern invisible. This may become the file that is printed onto the surfaces. This may guarantee that the image shows proper adjustments for rendering properly on a curved rather than flat surface. An image file may be produced from the mapping 1820 and overlay 1830, and this image file may be stored 1840, for example in a database 120. This image file may also be sent to a printer 1430 to enable printing of the sheathing as described above.

Figure 19:
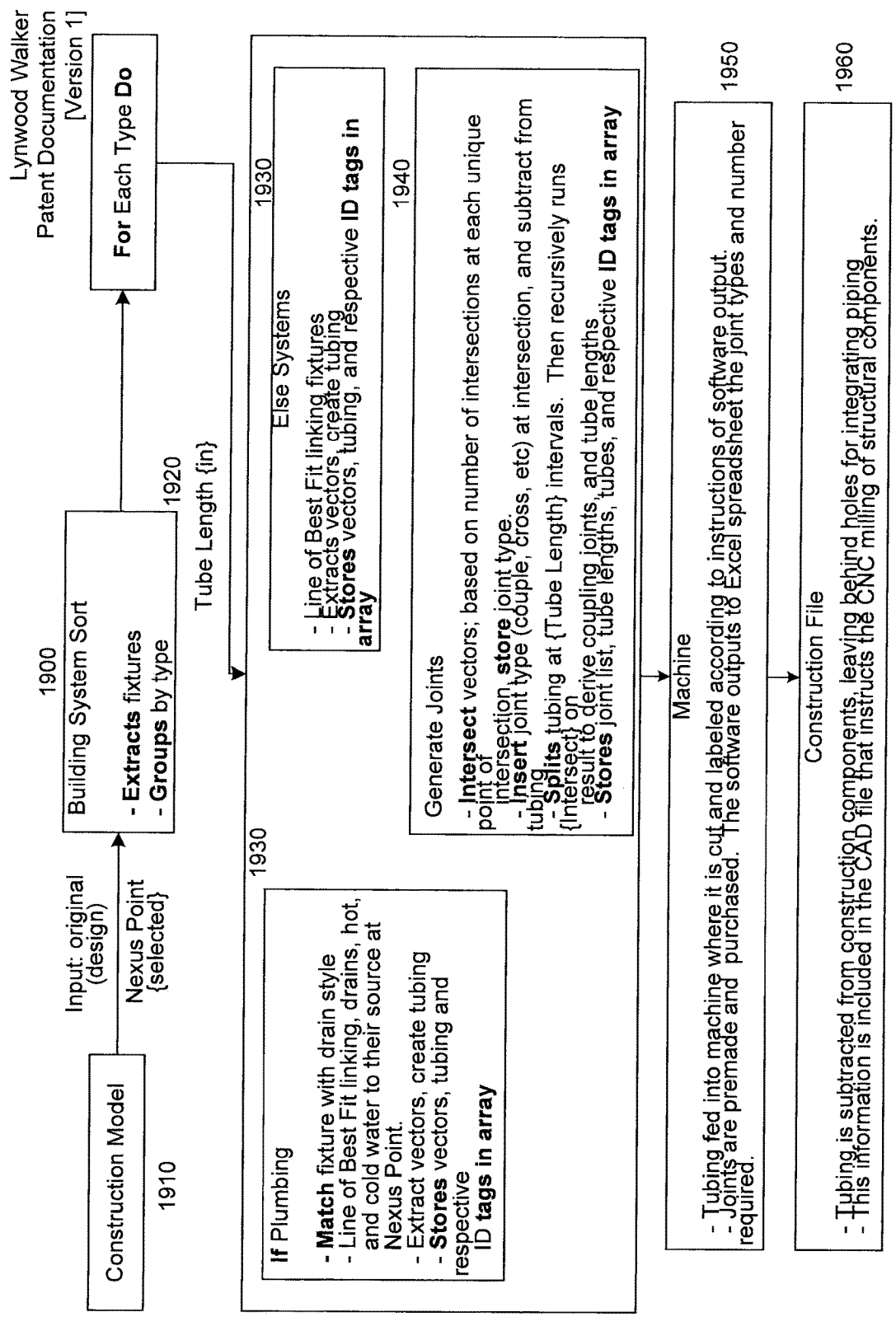
FIG. 19 is a method for placing building systems according to an embodiment of the invention.

FIG. 19 is a method for placing building systems 1900 according to an embodiment of the invention. Building systems may include plumbing, electrical wiring, and other elements which may be disposed within the interior of a building wall. This method 1900 may be used to modify previously generated building components (for example, building components generated with the processes described above) to accommodate these building systems. The abstraction engine computer 110 may receive a construction model 1910, which may be a CAD/CAM file or other data and may include a set of structural elements and building systems. The construction model may be input by a user via a user interface 130, it may be retrieved from a database 120, or it may be received by the abstraction engine computer 110 in some other way. The abstraction engine computer 110 may apply a building system sort 1920 to extract building system fixtures from the construction model and group the building system fixtures by type. For each type, the abstraction engine computer 110 may find best fits for the fixtures 1930 and generate joints 1940. The results may be fed into construction systems. For example, a tubing machine may receive joint data and use it to cut and label tubing and/or produce joints 1950. Premade joints may also be purchased using an inventory report generated by the abstraction engine computer 110. Furthermore, space for the building systems may be subtracted from the previously generated building components based on the best fit analysis, and the components may be modified in the files used for CNC milling as described above 1960. The various algorithms used by this method are described in greater detail below with respect to FIGS. 21-23.

Figure 20A:
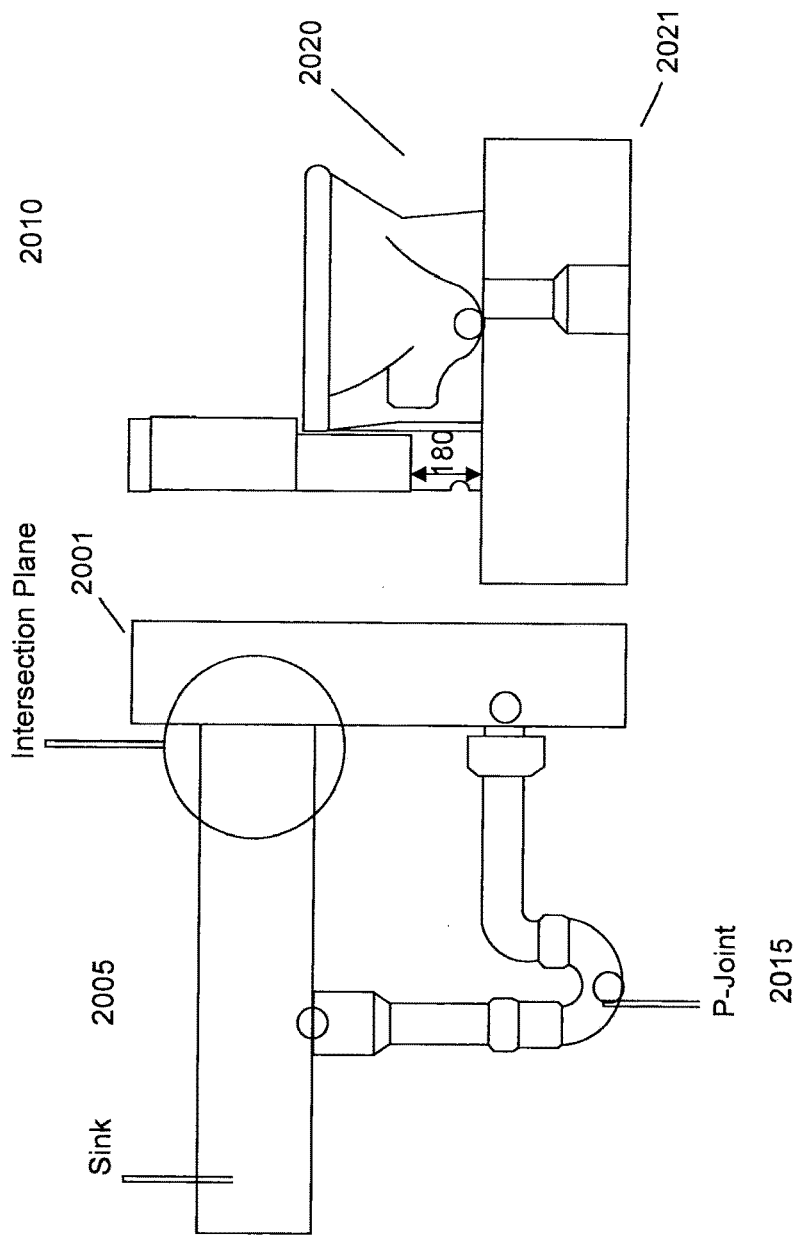
FIG. 20A is a construction model according to an embodiment of the invention.

FIG. 20A is a construction model 2000 according to an embodiment of the invention. In this example model 2000, building systems are integrated into a structure. A sink 2005 is one example of a building system. Here, the sink 2005 may intersect with a wall 2001 at an intersection plane 2010. The method 1900 of FIG. 19 may modify the wall 2001 to accommodate the sink 2005. The sink 2005 may be associated with pipes including a p-joint 2015. The pipes and joint 2015 may be generated by the method 1900 of FIG. 19. A toilet 2020 is another example of a building system. The floor 2021 may be modified by the method 1900 of FIG. 19 to accommodate plumbing for the toilet 2020.

Figure 20B:
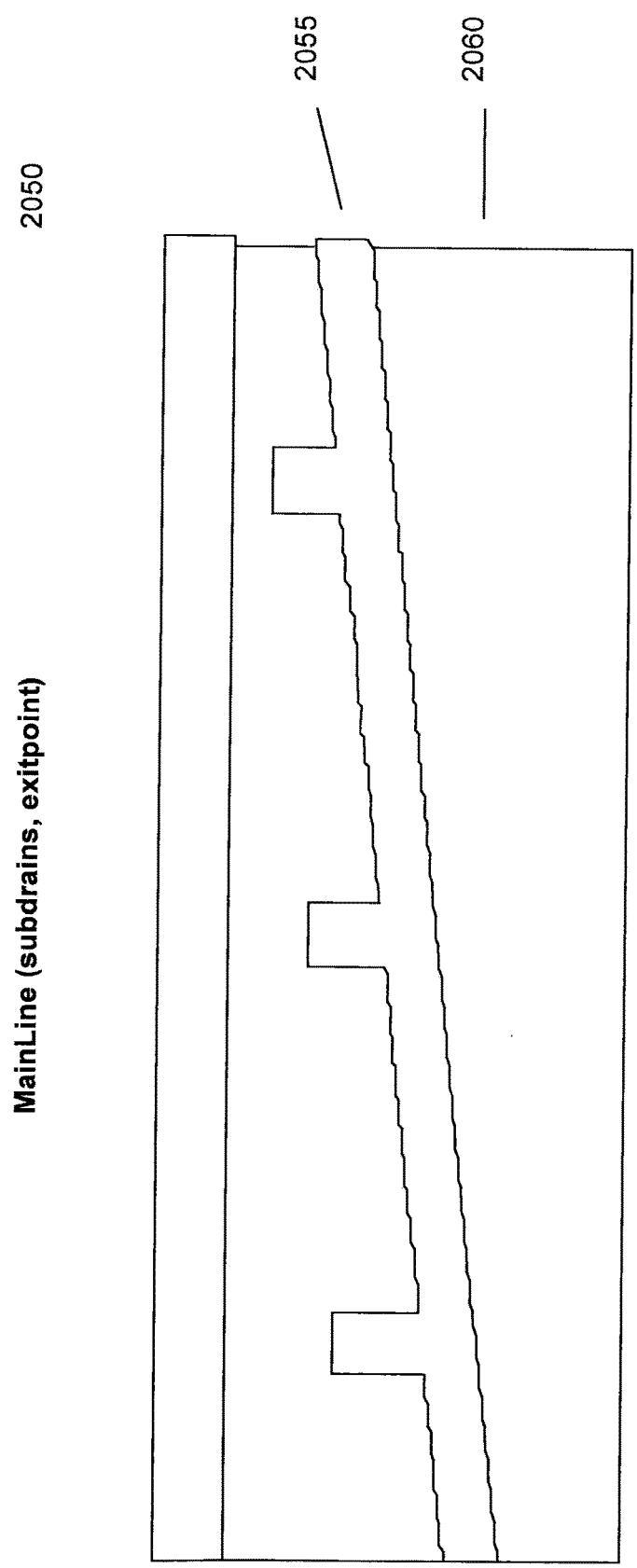
FIG. 20B is a construction model according to an embodiment of the invention.

FIG. 20B is a construction model 2050 according to an embodiment of the invention. A floor 2060 may be a building structure previously generated by the method of FIG. 3, for example. Space for a plumbing line 2055 may be inserted into the floor 2060 by the method 1900 of FIG. 19. Pipe lengths and joints for the line 2055 itself may also be generated by the method 1900 of FIG. 19.

Figure 20C:
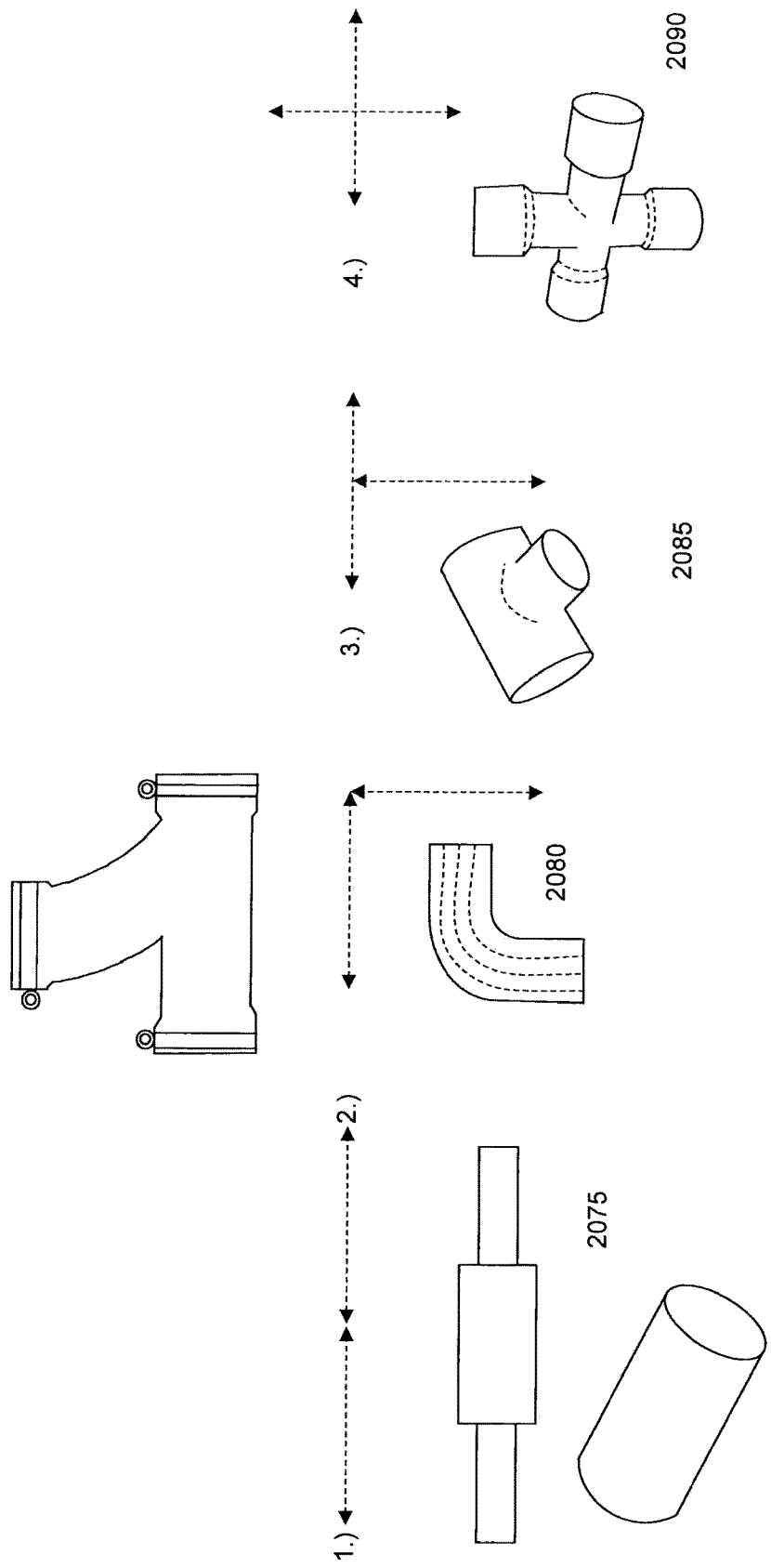
FIG. 20C is a set of joint types according to an embodiment of the invention.

FIG. 20C is a set of joint types according to an embodiment of the invention. The pictured joints 2075, 2080, 2085, and 2090 are examples of joints which may be generated by the method 1900 of FIG. 19, although other joints are possible.

Figure 21:
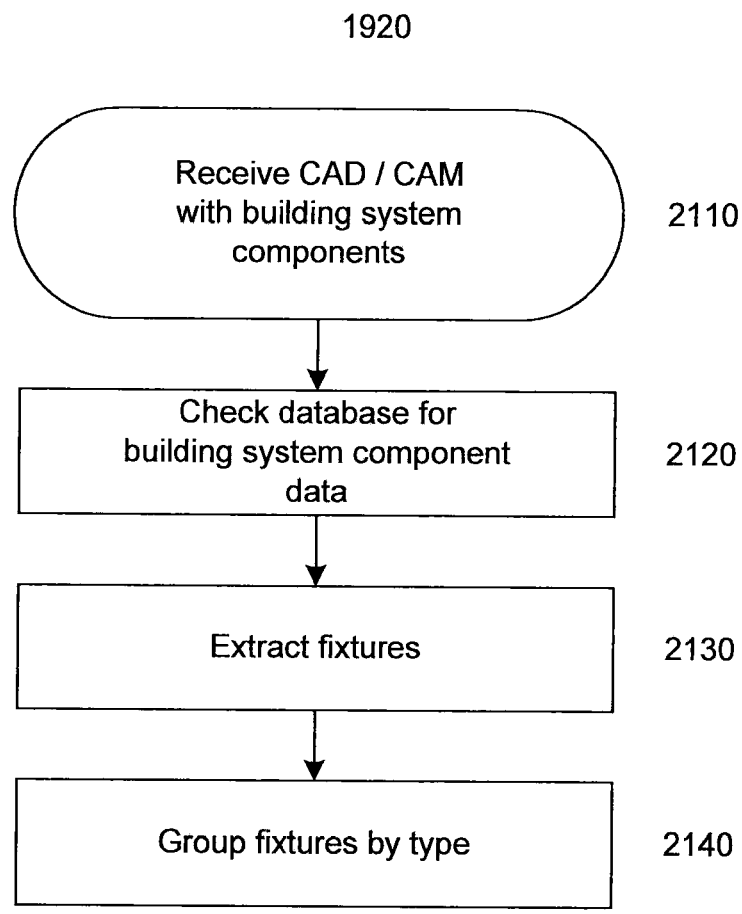
FIG. 21 is a building system sort algorithm according to an embodiment of the invention.

FIG. 21 is a building system sort algorithm 1920 according to an embodiment of the invention. Many building systems may have specific requirements, such as drains being paired with a p-joint or toilets requiring 2.5" diameter drains while hot and cold water piping can be 1" in diameter. The abstraction engine computer 110 may receive a construction model with building system components 2110 and check a database 120 for building system component data 2120. The component data may identify the requirements and/or specifications of the building systems identified in the model. The abstraction engine computer 110 may use the component data to further specify which fixtures are needed for the building. The abstraction engine computer 110 may extract the fixtures 2130 and group them by type 2140. For example, the abstraction engine computer 110 may store the fixtures under identifying tags such as drains, hot water, cold water, electrical, HVAC, etc.

Figure 22:
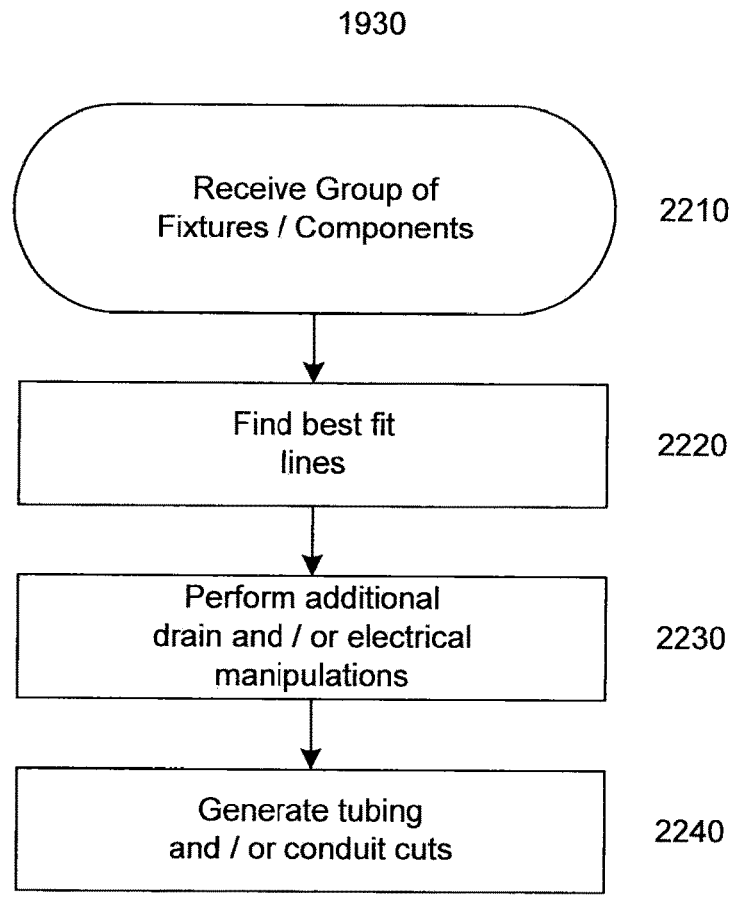
FIG. 22 is a best fit algorithm according to an embodiment of the invention.

FIG. 22 is a best fit algorithm 1930 according to an embodiment of the invention. The abstraction engine computer 110 may apply the best fit algorithm 1930 to the fixture data produced by the building sort algorithm 1920 and the building panels to provide space for the fixtures in the building panels. The abstraction engine computer 110 may receive the results of the building system sort 2210 on a group by group basis, for example hot water, drains, or electrical. The abstraction engine computer 110 may find orthogonal lines of best fit for connecting all fixtures under the same tag to each other within panels 2220. This may be accomplished by using an intersect function to determine a direction in which a fixture such as a pipe may pass through an intersecting wall in an effort to get from pt1=(X,Y,Z) to pt2=(A, B, C), where pt1 and pt2 are defined as the location of connecting fixtures. Depending on the fixture tag, additional manipulations may be performed 2230. For example, in the case of a drain, a vertical pipe may be required to be placed exiting the structure within 6 feet of a toilet. The abstraction engine computer 110 may identify an appropriate location for the vertical pipe. In another example, in the case of electrical wiring, electrical outlet boxes may be required to be placed at specified distances in contours of each room. The abstraction engine computer 110 may identify an appropriate location for each outlet. When lines and additional manipulations have been determined, the abstraction engine computer 100 may model the lines as cylinders or other spaces of a specified diameter or dimension 2240. The dimension for a particular space may depend on the type of element to be contained within, such as a hot water pipe, drain, or electrical conduit.

Figure 23:
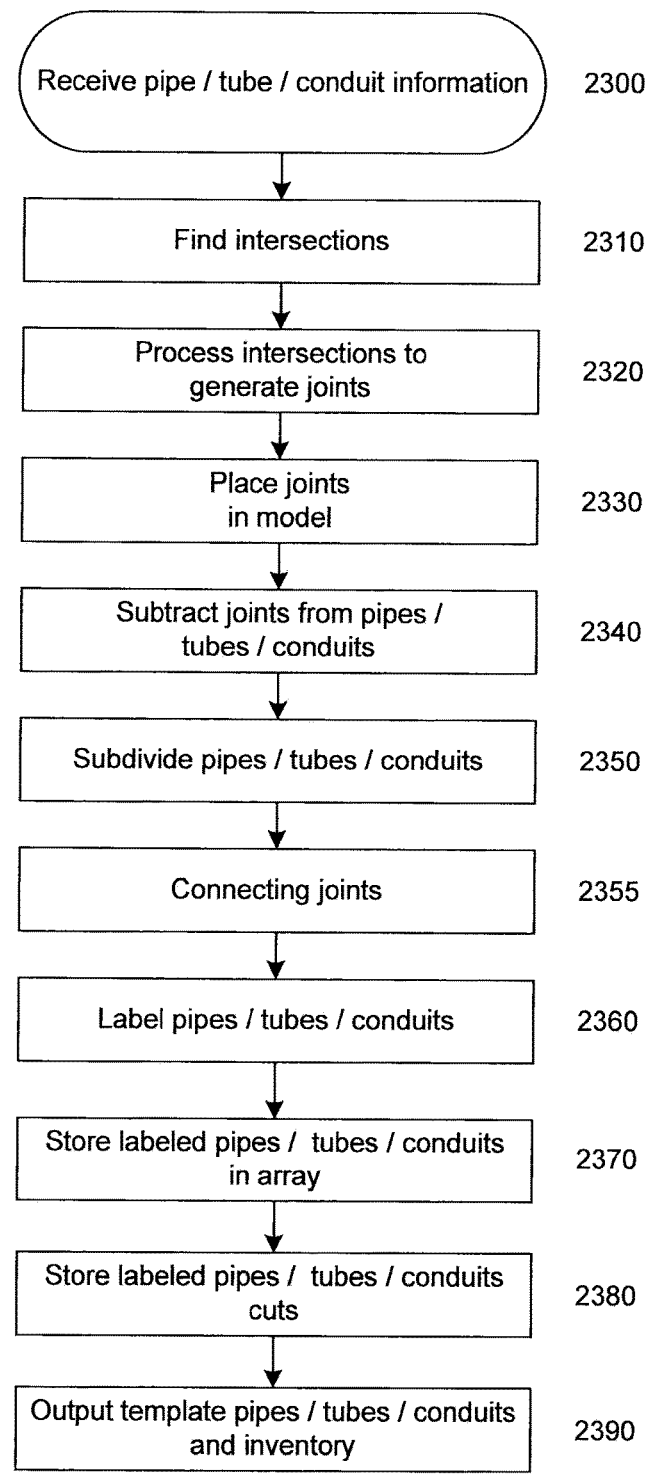
FIG. 23 is a joint sorting algorithm according to an embodiment of the invention.

FIG. 23 is a joint sorting algorithm 1940 according to an embodiment of the invention. The abstraction engine computer 110 may take building system pipes (from the construction model and best fit algorithm described above) and specification of maximum pipe lengths as inputs 2300. The maximum pipe lengths may be input by a user via a user interface 130, may be retrieved from a database 120, or may be received by the abstraction engine computer 110 in some other way. Pipes may be stored in separate arrays with tags specifying pipe type, for example drains, hot/cold water, electrical, etc. An intersect function may be used to find locations where pipes of the same tag intersect each other 2310. A generate joint function may be used to process the intersection and determine appropriate joints for each intersection 2320. For example, the generate joint function may produce outputs such as:

[If 2 pipes intersect and are parallel] coupling joint
[If 2 pipes intersect are orthogonal] cross joint
[If 3 pipes intersect; 2 parallel, 1 orthogonal] T-joint For type of intersection and relationship between pipes, a corresponding joint may be pulled from an inventory database and placed in the model 2330. Also, an inventory form may be updated to include an identification of each joint used. A subtract function may be used to subtract joints from all intersecting pipes in the model 2340. The abstraction engine computer 110 may use a subdivide function on the pipes to identify any remaining pipes longer than the specified maximum length and split them to lengths less than the maximum lengths 2350. The abstraction engine computer 110 may use the generate joint function to add coupling joints to join the split pipes 2355. Each pipe may be given a label 2360, and the label tag and length of each pipe may be stored in an array 2370. The abstraction engine computer 110 may use an efficient cuts algorithm to minimize waste and maximize number of pipes produced from each template 2380. The efficient cut algorithm may take as input the length of template pipes and the array(label tags, pipe lengths) and output efficiently produced cuts. If unused pipe remains, but no pipes in the array are of sufficient size, then current template pipe may be saved and marked with corresponding tags, and the process may repeat with a new template pipe. The abstraction engine computer 110 may output a file containing template pipes with cuts and tags specified as well as an inventory file containing a list of joints-types used and a number of joints of each type required 2390.

In one example, magnetized conduits and/or joints may be generated according to the methods of FIGS. 21-23. Magnetic conduits may connect like plumbing does with couple joints, T-joints, cross joints, etc. However, the magnetic conduits and joints may be magnetized to distribute eddy currents and/or for ease of assembly. The magnetic joints may eliminate a need to thread the wiring within the conduit, and may allow electricity to flow through a series of conduits and/or joints due to the surface-surface contact of the metal leads. Also, these magnetic conduits and joints may include layers (for example two insulator layers with a metal layer sandwiched between) to create a waveguide allowing for the electrical system to propagate electromagnetic radiation, for example microwave radiation. This may create an electrical circuit throughout the structure, as well as an optical circuit. The optical circuit may enable the use of highly energy efficient electrodeless lighting elements.

Figure 24:
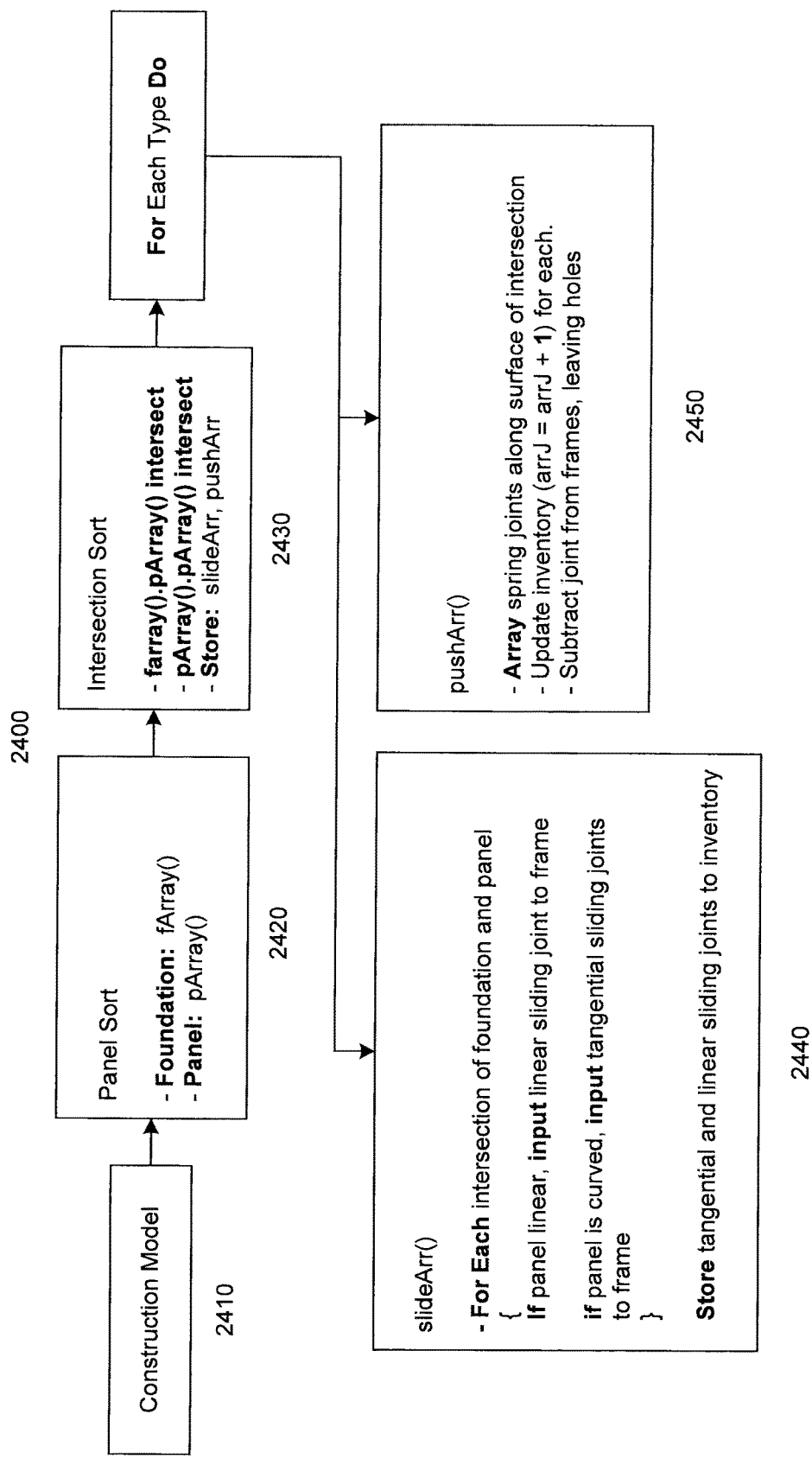
FIG. 24 is a method for generating joints according to an embodiment of the invention.
Figure 25A:
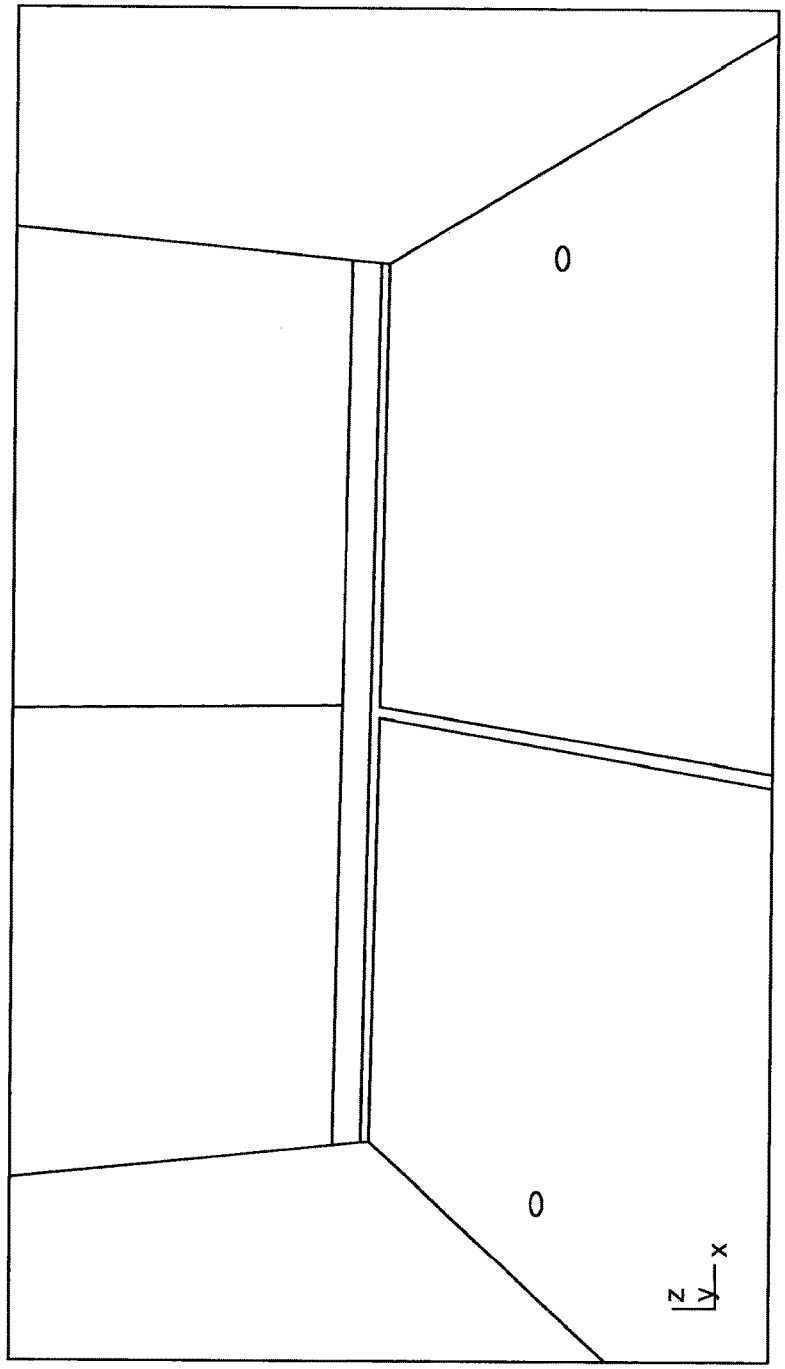
FIG. 25A is a design model according to an embodiment of the invention.
Figure 25B:
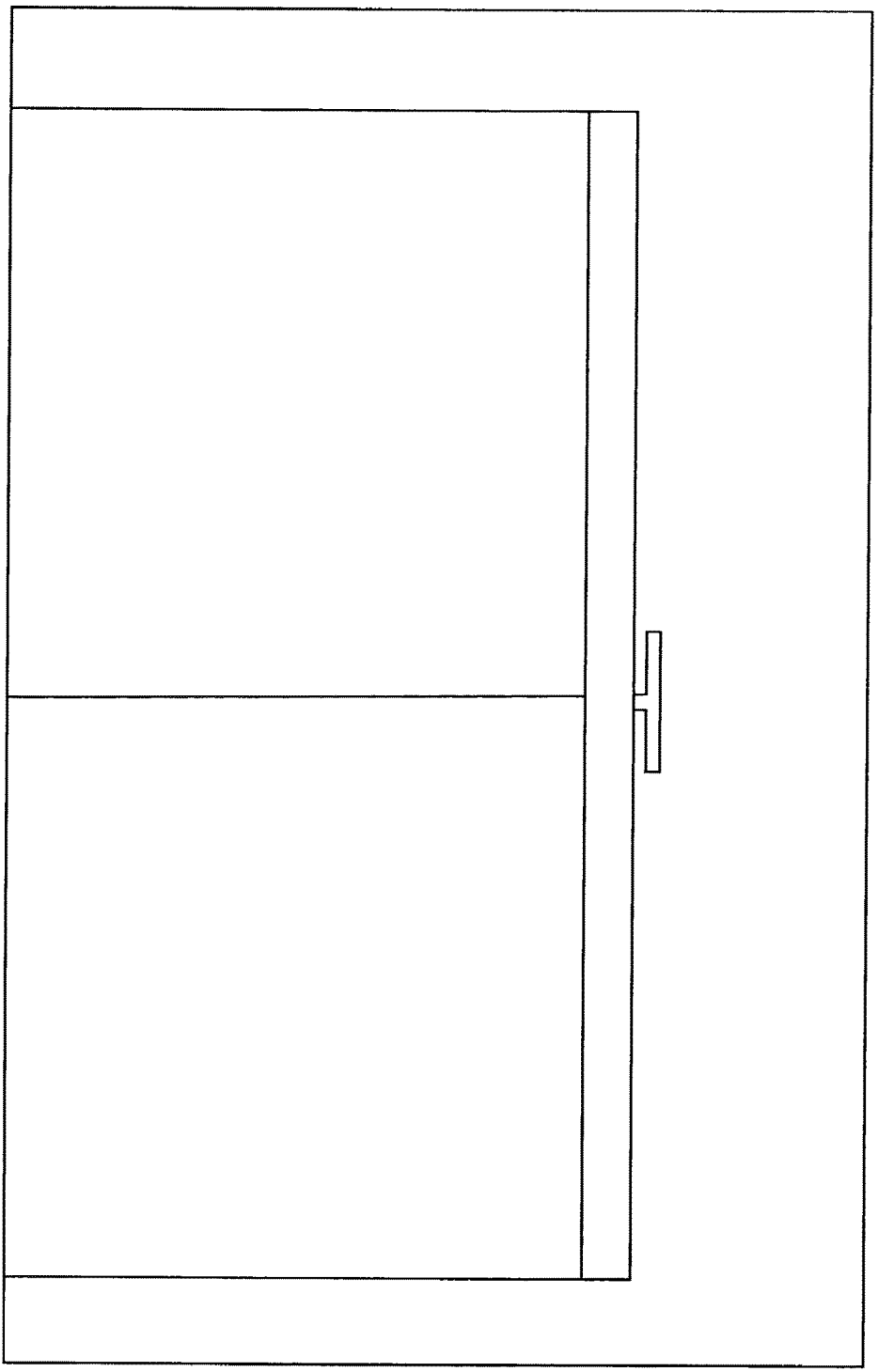
FIG. 25B is a design model according to an embodiment of the invention.
Figure 25C:
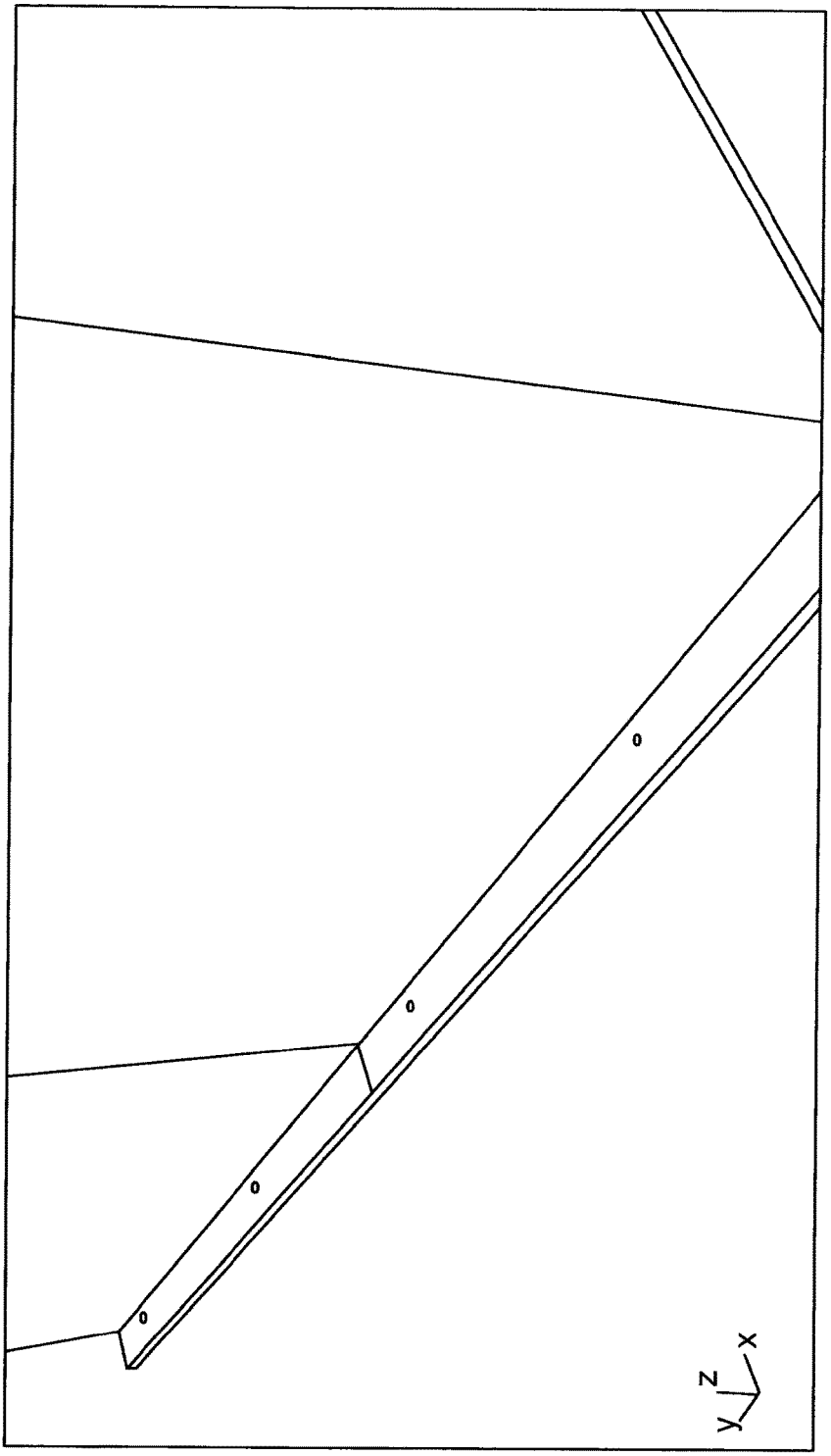
FIG. 25C is a design model according to an embodiment of the invention.
Figure 25D:
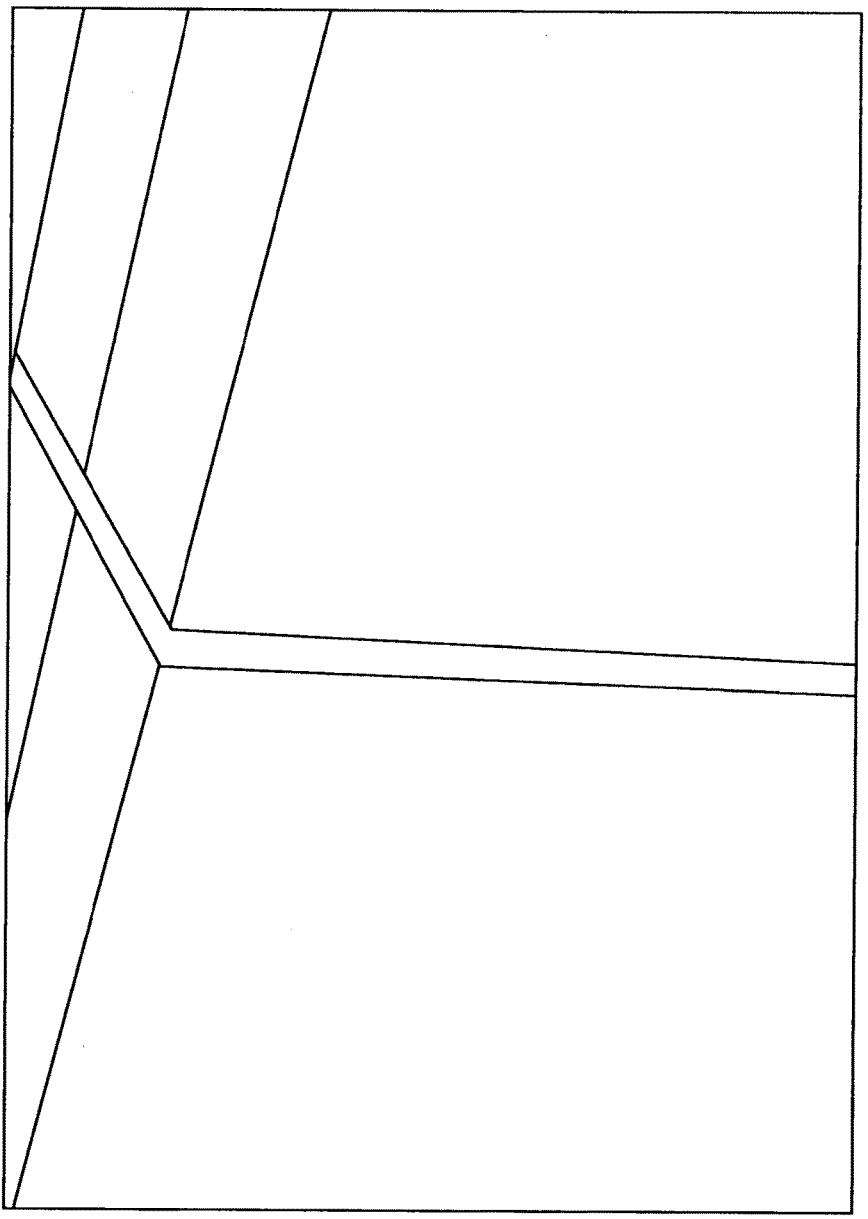
FIG. 25D is a design model according to an embodiment of the invention.
Figure 25F:
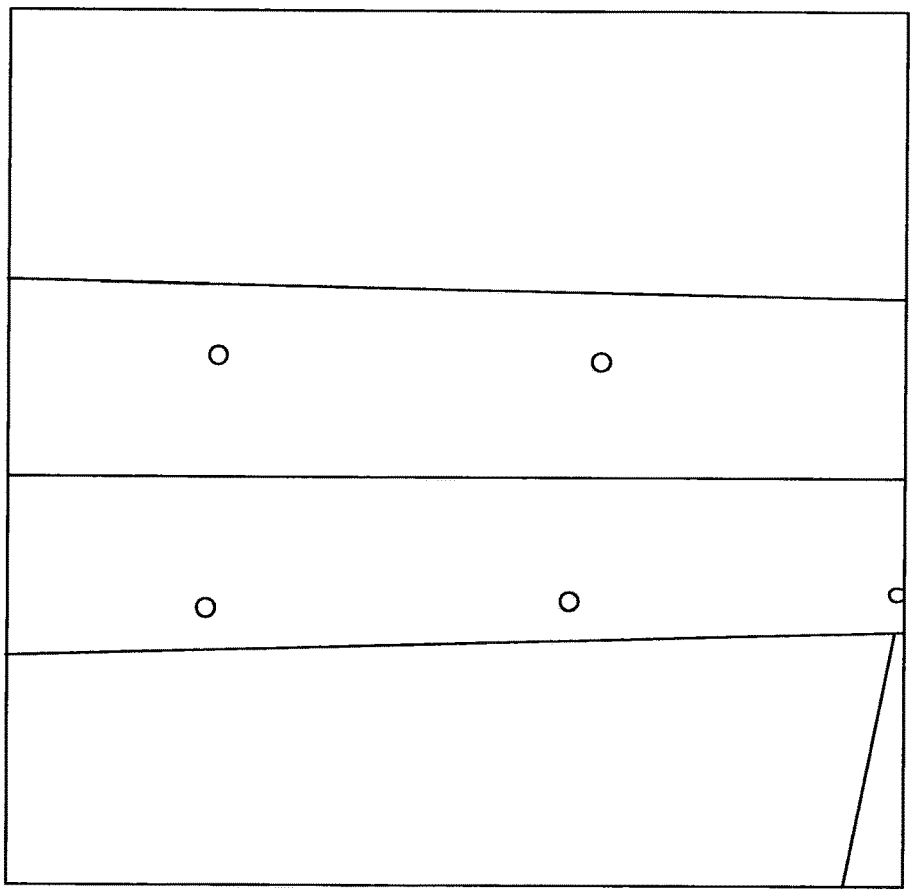
FIG. 25F is a design model according to an embodiment of the invention.

FIG. 24 is a method for generating joints 2400 according to an embodiment of the invention. This method 2400 may be used to generate and place joints in the various panels, frames, and/or other objects created as described above. For example, push joints 225 such as those described with respect to FIGS. 2A-2B and/or slide joints may be used to join the objects. The abstraction engine computer 110 may take a construction model as input 2410. The construction model may be input by a user via a user interface 130, may be retrieved from a database 120, or may be received by the abstraction engine computer 110 in some other way. For example, the construction model may include the data about various objects generated by the abstraction engine computer 110 as described above. The abstraction engine computer 110 may apply a panel sort algorithm to the construction model 2420, which may identify and locate the panels in the model. The abstraction engine computer 110 may apply a panel intersection sort algorithm to the panels 2430. The panel intersection sort algorithm may loop through the frame members of all panels and find which frames intersect with other panel frames, and which frames intersect with roof/floor systems. Panel intersections may stored in arrays. Panel-panel intersections and panel-floor/roof intersections may be stored in separate arrays. For each intersecion array, the abstraction engine computer 110 may generate joints. For example, the abstraction engine computer 110 may apply a slide joint algorithm to the panel-floor/roof intersections 2440. The abstraction engine computer 110 may pull from the database 120 one of two pre-defined joints for integration for each intersection, for example. These joints may be slide joints or plate joints. A slide joint may contain two components, a plate that connects directly to the frame and has attached a male-tab and a female plate that connects to foundation or roof members and receives the male joints. The female plate may be fixed to the foundation with screws or other fasteners. The male plate joint may be connected directly to the frame through welding of the materials, and/or screwing into the foundation as with the female plate. The database 120 may contain 2D outlines of the male/female slide joints and the plate shapes in cross section. These line drawings may be pulled and placed in the 3D environment at the base of the frame by the abstraction engine computer 110. The lines may then be extruded such that the 2D line drawing becomes a 3D object of depth equal to that of the panel dimension. FIGS. 25A-C depict example slide/plate joints which may be created by this algorithm 2440. The abstraction engine computer 110 may apply a push joint algorithm to the panel-panel intersections 2450. This algorithm may generate a cylinder of arbitrary length and radius dictated by user input or requirements stored in the database 120. This cylinder may be arrayed along the intersecting panel frames as user specifies or specifications dictate. For example, the number of cylinders may be chosen according to the structural strength required. An array may be defined as a function that creates copies of a solid, line, or point such that they are distributed at specified intervals in X,Y,Z directions. For example, cylinders may be arrayed on (X,Y), (Y,Z), or (X,Z) planes corresponding to the dimensions of the intersecting frame members. Once the cylinders have been placed, they may be subtracted from the frames, leaving behind holes. The number of cylinders created may be counted and stored in the inventory database 120 to keep track of the number of push joints that correspond to the number of holes. Push joints may be made identical so that the abstraction engine computer 110 does not need to keep track of 3D push joint representations, though it may in some embodiments. FIGS. 25D-F depict example push joints which may be generated by this algorithm 2450.

When the processes described above are completed for a building project, the resulting designs may be constructed. An example construction process may proceed as follows:

1. CNC Cutting: Standard CNC Laser, WaterJet, or router may be used to mill 2D components as dictated by the output files. CNC machinery with modifications as described above in FIG. 2A may be used to promote modular builds, variable sizes, and compact/lightweight shipping. For example, a CNC bed may comprise 20'×10' modules that can be arrayed to print longer and wider panels and folded for efficient packing.

2. Building Systems Pipe Cutting: A linear robotically controlled machine may use laser, waterjet, or router to mill from template piping and conduit the specified dimension of material as dictated by the output file from the building system algorithms.

3. Manual Assembly: Based on instructions in the 3D file map, the 2D components may be assembled into 3D form and building systems may be inserted into prepared slots.

4. Sheathing Preparation: Automated cutting of the sheathing using CNC machinery, in conjunction with a vacuum forming process for fitting sheathing to the contour of the 3D panel may be performed.

5. Sheathing Finishing Application: Large-format printer may produce a texture map on a thin film roll, and a vacuum forming process may fit the map to the sheathing prior to welding.

6. Insulation Application: Robotic CNC equipment may extrude insulation into panel cavities 7. Assembly: Machinery may assemble large panels.

8. Finishes Application: Wood flooring, tile, etc. may be cut into modular pieces contoured to the sheathing shape.

Figure 26:
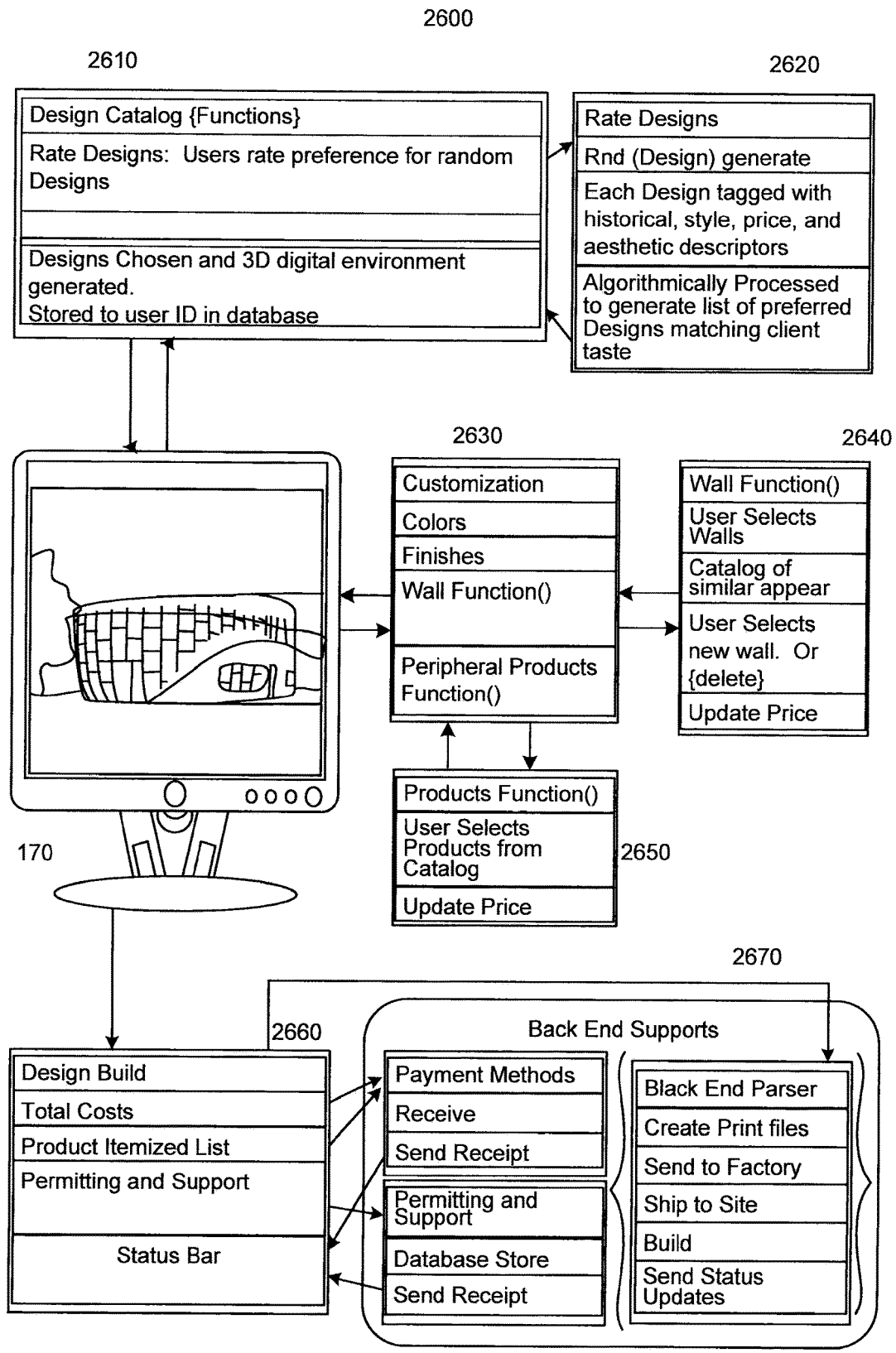
FIG. 26 is a system according to an embodiment of the invention.

FIG. 26 is a system 2600 according to an embodiment of the invention A computer 170 may be in communication, for example via the internet, with one or more servers which may perform the functions depicted in FIG. 26. In other embodiments, the functions shown in FIG. 26 may be performed locally by the computer 170. As seen in FIG. 26, the system 2600 may provide a design catalog 2610 and design rating function 2620, customization 2630 with wall selection 2640 and/or product selection 2650, purchasing system 2660, and/or back end support 2670. Using object model data generated according to the processes described above, the system 2600 may generate 3D models of structures. Construction models (design models used to create the fabrication files) may be loaded by the system 2600. Construction models may be uploaded by a user and/or may be available within a design catalog 2610. A user may choose designs from the design catalog 2610 for display and may rate the designs in the catalog 2610. A design rating function 2620 may display various designs to a user, for example randomly, and receive a user rating of displayed designs. The user ratings may be used by the design rating function 2620 to assess user preferences and select designs more likely to appeal to the user.

The models may include the layers that define walls, floors, and various building systems such as toilets and sinks. Also included may be stoves, furnishings, decorations, and people. Each 3D object in the model may be represented as a layered entity, so functions such as obj.visible may be used to turn layers on or off. Turning a layer on may cause the layer to appear in the model. Turning a layer off may cause the layer to disappear. A customization function 2630 may allow a user to modify a model, for example by providing choices of object colors and finishes and/or by allowing a user to modify building elements and/or peripheral products.

Elements may be placed into different classes. For example, a building elements class may govern walls, floors, and roof structures. Objects in this class may have attributes such as colors, finishes, coordinates, dimensions, prices, and wall function( )2640. The wall function 2640 may be an algorithm that, based on the dimensions of the building element, may search a database 120 for all walls that have identical dimension elements. So for instance, if a wall is 4'×10', only existing walls within the database that are also this size may be found. These walls may be curved, angular, or in a multitude of configurations as long as a rectilinear box that encompasses the structure has XY dimensions of 4'×10'. A user may select a wall that appeals to them, and the selected wall be placed at the same coordinates as the original.

A peripheral product class may govern furnishings or fixtures that do not make up the structure of the building but may be placed in the building. Objects in this class may have coordinates, dimensions, tags, prices, and a peripheral product function( )2650. This function 2650 may search the database 120 for all products of similar tag that fit within the dimensional constraints specified. For instance, if one wanted to change out a sink for a new design, the system 1600 may use the tag 'sink' to search for all instances of sinks in the database 120 and allow the user to browse these to select a sink for placement in the model.

The system 2600 may allow a user to purchase buildings and/or building elements displayed to the user by the system 2600. The purchasing system 2660 may function by accessing the full itemized list of elements within the 3D environment that are linked to the purchasing user (i.e., a set of elements associated with the selections made with functions 2610-2650 described above). Elements such as building elements and peripheral products may be sorted and itemized and associated with prices. For example, a selection of a home with 10 walls and 5 floor and roof members may cause the purchasing system 2660 to produce a data form containing each of these objects, the standard costs per panel for rectilinear, single curvature, and multi curvature features, and any additional costs for personalized colors or finishes added. These per panel costs may then be added to obtain a total cost for purchasing the unit. If the user also specifies toilets, sinks, cabinets, furniture, and other systems, these also would be itemized according to purchase and installation costs to derive an overall cost. When the user indicates that they are ready to purchase, these costs, element information, and the resultant design may be stored in a purchasing database 120 for access by vendors. In some embodiments a user may be contacted by a sales representative to finalize the order and setup payments. In other embodiments users may be able to purchase units directly online Financing plans may be made available. Also, cloudsourcing processes may be made available to allow multiple individuals to pay towards the construction of the same building, for example in the case of humanitarian housing wherein multiple users may have access to the design and the payment structure. In another example, bridal registries may enable groups to make payments towards the costs of a structure. Payment, building permitting (which may include contacting users for paperwork approval), material ordering, construction plan generation, and/or other functions may be handled by a back end system 2670, which may include the abstraction engine computer 110 for plan generation in some embodiments. If all portions of the design are premade in a database 120, then a print file prepared for a fabrication facility by the back end system 2670 may pull cut files that correspond to each individual wall from the database 120. If any walls are novel, these may be converted and then appending to the cut file according to the processes described above. If the whole house is from the catalog with no changes, the full home file may be printed with no intermediate steps. The system 2600 may also allow for additions to existing structures to be generated in a similar manner.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, while the above examples are presented in the context of OPSs 200 connecting to nodes 150, it will be understood that the systems and methods described herein can be performed by any interconnected computers. Thus, the present embodiments should not be limited by any of the above-described embodiments.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112, paragraph 6. Claims that do not expressly include the phrase "means for" or "step for" are not to be interpreted under 35 U.S.C. 112, paragraph 6.

What is claimed is:

1. A method comprising:
   receiving, with a processor in communication with a database, a design model comprising building specifications;
   defining, with the processor, a panel in the design model;
   generating, with the processor, a frame design and a sheathing design for the panel; and
   generating, with the processor, fabrication instructions for the panel the fabrication instructions being configured to cause at least one automated construction system to automatically construct the panel: wherein either:
   the defining of the panel comprises:
      identifying, with the processor, a structural block in the design model,
      identifying, with the processor, a largest closed surface on the structural block and a closed surface closest to a ground plane on the structural block,
      determining, with the processor, a border of the largest closed surface,
      determining, with the processor, a border of the closed surface closest to the ground plane,
      transforming, with the processor, the border of the largest closed surface and the border of the closed surface closest to the ground plane into intersecting lines that intersect at edges or vertices where the largest closed surface and the closed surface closest to the ground plane meet,
      generating, with the processor, intersecting planes at predetermined intervals from the intersecting lines,
      determining, with the processor, points of intersection between the intersecting planes and the structural block,
      splitting, with the processor, the structural block at the points of intersection between the intersecting planes and the structural block to create a plurality of split sections of the structural block,
      defining, with the processor, each split section of the structural block as a panel, and extracting, with the processor, a frame surface design and a sheathing surface design from the panel; or
   the generating of the frame design and the sheathing design for the panel comprises:

receiving, with the processor, material and/or structural specifications, extracting, with the processor, a frame surface design and a sheathing surface design from the panel according to the material and/or structural specifications, extruding, with the processor, the frame surface design and the sheathing surface design according to the material and/or structural specifications, subtracting, with the processor, the extruded frame surface design and the extruded sheathing surface design from the panel to determine a cavity, and defining, with the processor, the frame surface design and the sheathing surface design as a panel comprising the frame design and the sheathing design, or a combination thereof.

2. The method of claim 1, wherein the generating of the frame design and the sheathing design for the panel further comprises:

identifying, with the processor, a largest closed surface on the panel comprising the frame design and the sheathing design and a closed surface having a surface area closest to the ground plane on the panel comprising the frame design and the sheathing design;

determining, with the processor, a border of the largest closed surface;

determining, with the processor, a border of the closed surface closest to the ground plane;

transforming, with the processor, the border of the largest closed surface and the border of the closed surface closest to the ground plane into intersecting lines;

generating, with the processor, intersecting planes at predetermined intervals from the intersecting lines;

determining, with the processor, points of intersection between the intersecting planes and the panel comprising the frame design and the sheathing design;

splitting, with the processor, the panel comprising the frame design and the sheathing design at the points of intersection between the intersecting planes and the panel to create a plurality of split sections of the panel; and labeling, with the processor, each split section of the panel comprising the frame design and the sheathing design.

3. The method of claim 1, wherein the generating of the frame design for the panel comprises:

identifying, with the processor, a plurality of frame members for the frame design;

determining, with the processor, points of intersection between the plurality of frame members;

splitting, with the processor, the frame design at the points of intersection between the frame members to create a plurality of split sections of the frame design;

generating, with the processor, connectors configured to connect the plurality of frame members at the points of intersection; and labeling, with the processor, each split section of the frame design.

4. The method of claim 1, wherein the generating of the frame design for the panel comprises:

generating, with the processor, a rib structure design for the frame design based on a load per area to be supported and/or a construction material characteristic.

5. The method of claim 1, wherein the generating of the frame design and the sheathing design for the panel further comprises:

receiving, with the processor, an opening for the panel;

subtracting, with the processor, the opening from the frame surface design and the sheathing surface design;

identifying, with the processor, a plurality of frame members for the frame design, wherein the frame members are not located at the opening;

determining, with the processor, points of intersection between the plurality of frame members;

splitting, with the processor, the frame design at the points of intersection between the frame members to create a plurality of split sections of the frame design;

generating, with the processor, connectors configured to connect the plurality of frame members at the points of intersection; and labeling, with the processor, each split section of the frame design.

6. The method of claim 1, further comprising:

receiving, with the processor, a maximum dimension;

determining, with the processor, a dimension of the frame design and/or of the sheathing design;

when the dimension of the frame design and/or of the sheathing design is greater than the maximum dimension, defining, with the processor, a cutplane for the frame design and/or the sheathing design;

splitting, with the processor, the frame design and/or the sheathing design into a plurality of segments along the cutplane;

determining, with the processor, points of intersection between the plurality of segments;

generating, with the processor, connectors configured to connect the plurality of segments at the points of intersection; and labeling, with the processor, each segment.

7. The method of claim 1, further comprising:

receiving, with the processor, a maximum area;

determining, with the processor, an area of the frame design and/or of the sheathing design;

fitting, with the processor, the frame design and/or the sheathing design into the maximum area; and generating, with the processor, a specification including the fit of the frame design and/or the sheathing design into the maximum area.

8. The method of claim 1, further comprising:

checking, with the processor, the database to determine an availability of a component of the panel in an inventory;

when the component is available, removing, with the processor, the component from the database; and when the component is not available, generating, with the processor, an order for the component.

9. The method of claim 1, further comprising operating a computer numerical control (CNC) system according to the fabrication instructions.

10. The method of claim 1, further comprising generating, with the processor, a surface design for the panel.

11. The method of claim 10, wherein the generating of the surface design further comprises:

identifying, with the processor, an exposed surface of the panel;

determining, with the processor, a border of the exposed surface;

transforming, with the processor, the border of the exposed surface into intersecting lines;

mapping, with the processor, the intersecting lines into a linear approximation to produce a two dimensional surface design;

extracting, with the processor, a border contour for the two dimensional surface design;

mapping, with the processor, a texture design to the two dimensional surface design;
generating, with the processor, a shape contour and a modified texture map corresponding to the two dimensional surface design and texture design.

12. The method of claim 10, wherein the generating of the surface design further comprises:
identifying, with the processor, an exposed surface of the panel;
approximating, with the processor, a triangle tessellation to a curvature of the exposed surface;
mapping, with the processor, a triangle to the triangle tessellation;
generating, with the processor, a two dimensional surface design from the mapped triangle;
extracting, with the processor, a border contour for the two dimensional surface design;
mapping, with the processor, a texture design to the two dimensional surface design;
generating, with the processor, a shape contour and a modified texture map corresponding to the two dimensional surface design and texture design.

13. The method of claim 10, further comprising printing the surface design.

14. The method of claim 1, further comprising:
identifying, with the processor, a fixture design; and
modifying, with the processor, the panel to include space for the fixture design.

15. The method of claim 14, wherein the identifying of the fixture design includes determining, with the processor, a fixture type.

16. The method of claim 15, further comprising searching, with the processor, the database to determine a spatial requirement of the fixture type.

17. The method of claim 14, wherein the modifying of the panel comprises:
determining, with the processor, at least one best fit line within the panel for the fixture design, the at least one best fit line defining a location within the panel that fits the fixture design; and
subtracting, with the processor, a space along the at least one best fit line from the frame design and/or the sheathing design.

18. The method of claim 17, further comprising determining, with the processor, a dimension of the space based on a spatial requirement of the fixture design.

19. The method of claim 17, further comprising subtracting, with the processor, an additional space from the frame design and/or the sheathing design based on a spatial requirement of the fixture design.

20. The method of claim 1, further comprising:
identifying, with the processor, a fixture design; and
generating, with the processor, fabrication instructions for the fixture design.

21. The method of claim 20, wherein the generating of the fabrication instructions for the fixture design comprises determining a dimension of a pipe design and/or a conduit design.

22. The method of claim 20, wherein the generating of the fabrication instructions for the fixture design comprises:
receiving, with the processor, a maximum dimension for each of a plurality of pipe designs and/or conduit designs;
locating, with the processor, an intersection point where the plurality of pipe designs and/or conduit designs intersect according to the fixture design;
generating, with the processor, a joint design corresponding to the intersection point;
modifying, with the processor, the plurality of pipe designs and/or conduit designs to accept the joint design;
when one of the plurality of pipe designs and/or conduit designs has a dimension greater than the maximum dimension, dividing, with the processor, the one of the plurality of pipe designs and/or conduit designs; and
labeling, with the processor, the plurality of pipe designs and/or conduit designs.

23. The method of claim 22, wherein the generating of the fabrication instructions for the fixture design further comprises:
receiving, with the processor, a maximum length;
determining, with the processor, a length of each of the plurality of pipe designs and/or conduit designs;
fitting, with the processor, the plurality of pipe designs and/or conduit designs into the maximum length; and
generating, with the processor, a specification including the fit of the plurality of pipe designs and/or conduit designs into the maximum length.

24. The method of claim 20, further comprising operating a tubing system according to the fabrication instructions for the fixture.

25. The method of claim 1, further comprising:
determining, with the processor, an intersection between the panel and another surface; and
generating, with the processor, a joint design for the intersection.

26. The method of claim 25, wherein:
when the intersection is between the panel and a second panel, the joint design is a push joint design and the generating of the push joint design comprises extracting, with the processor, a three-dimensional geometry from the panel at a point on the intersection and a corresponding three-dimensional geometry from the second panel at a corresponding point on the intersection; and
when the intersection is between the panel and a floor or ceiling, the joint design is a slide joint design and the generating of the slide joint design comprises generating, with the processor, a joint hardware element design and extracting, with the processor, a space for the joint hardware element design from the panel.

27. The method of claim 1, further comprising:
generating, with the processor, a visual model of a structure according to the frame design and the sheathing design; and
causing, with the processor, the visual model to be displayed on a display.

28. The method of claim 27, further comprising:
receiving, with the processor, a user command associated with the visual model; and
performing, with the processor, an action in response to the user command, the action comprising modifying the visual model, associating a rating with the visual model, requesting a payment associated with the visual model, and/or generating construction instructions associated with the visual model.

29. A system comprising:
a database; and
a processor in communication with the database, the processor constructed and arranged to:
receive a design model comprising building specifications;
define a panel in the design model;

generate a frame design and a sheathing design for the panel and generate fabrication instructions for the panel, the fabrication instructions being configured to cause at least one automated construction system to automatically construct the panel; wherein either:

the processor is constructed and arranged to define the panel by:

identifying a structural block in the design model, identifying a largest closed surface on the structural block and a closed surface closest to a ground plane on the structural block, determining a border of the largest closed surface, determining a border of the closed surface closest to the ground plane, transforming the border of the largest closed surface and the border of the closed surface closest to the ground plane into intersecting lines that intersect at edges or vertices where the largest closed surface and the closed surface closest to the ground plane meet, generating intersecting planes at predetermined intervals from the intersecting lines, determining points of intersection between the intersecting planes and the structural block, splitting the structural block at the points of intersection between the intersecting planes and the structural block to create a plurality of split sections of the structural block, defining each split section of the structural block as a panel, and extracting a frame surface design and a sheathing surface design from the panel; or the processor is constructed and arranged to generate the frame design and the sheathing design for the panel by:

receiving material and/or structural specifications, extracting a frame surface design and a sheathing surface design from the panel according to the material and/or structural specifications, extruding the frame surface design and the sheathing surface design according to the material and/or structural specifications, subtracting the extruded frame surface design and the extruded sheathing surface design from the panel to determine a cavity, and defining the frame surface design and the sheathing surface design as a panel comprising the frame design and the sheathing design, or a combination thereof.

30. The system of claim 29, wherein the processor is further constructed and arranged to generate the frame design and the sheathing design for the panel by:

identifying a largest closed surface on the panel comprising the frame design and the sheathing design and a closed surface having a surface area closest to the ground plane on the panel comprising the frame design and the sheathing design;

determining a border of the largest closed surface;

determining a border of the closed surface closest to the ground plane;

transforming the border of the largest closed surface and the border of the closed surface closest to the ground plane into intersecting lines;

generating intersecting planes at predetermined intervals from the intersecting lines;

determining points of intersection between the intersecting planes and the panel comprising the frame design and the sheathing design;

splitting the panel comprising the frame design and the sheathing design at the points of intersection between the intersecting planes and the panel to create a plurality of split sections of the panel; and labeling each split section of the panel comprising the frame design and the sheathing design.

31. The system of claim 29, wherein the processor is constructed and arranged to generate the frame design for the panel by:

identifying a plurality of frame members for the frame design;

determining points of intersection between the plurality of frame members;

splitting the frame design at the points of intersection between the frame members to create a plurality of split sections of the frame design;

generating connectors configured to connect the plurality of frame members at the points of intersection; and labeling each split section of the frame design.

32. The system of claim 29, wherein the processor is constructed and arranged to generate the frame design for the panel by:

generating a rib structure design for the frame design based on a load per area to be supported and/or a construction material characteristic.

33. The system of claim 29, wherein the processor is further constructed and arranged to generate the frame design and the sheathing design for the panel by:

receiving an opening for the panel;

subtracting the opening from the frame surface design and the sheathing surface design;

identifying a plurality of frame members for the frame design, wherein the frame members are not located at the opening;

determining points of intersection between the plurality of frame members;

splitting the frame design at the points of intersection between the frame members to create a plurality of split sections of the frame design;

generating connectors configured to connect the plurality of frame members at the points of intersection; and labeling each split section of the frame design.

34. The system of claim 29, wherein the processor is further constructed and arranged to:

receive a maximum dimension;

determine a dimension of the frame design and/or of the sheathing design;

when the dimension of the frame design and/or of the sheathing design is greater than the maximum dimension, define a cutplane for the frame design and/or the sheathing design;

split the frame design and/or the sheathing design into a plurality of segments along the cutplane;

determine points of intersection between the plurality of segments;

generate connectors configured to connect the plurality of segments at the points of intersection; and label each segment.

35. The system of claim 29, wherein the processor is further constructed and arranged to:

receive a maximum area;

determine an area of the frame design and/or of the sheathing design;

fit the frame design and/or the sheathing design into the maximum area; and generate a specification including the fit of the frame design and/or the sheathing design into the maximum area.

36. The system of claim 29, wherein the processor is further constructed and arranged to:

check the database to determine an availability of a component of the panel in an inventory;

when the component is available, remove the component from the database; and when the component is not available, generate an order for the component.

37. The system of claim 29, wherein the processor is further constructed and arranged to send the fabrication instructions to a computer numerical control (CNC) system.

38. The system of claim 29, wherein the processor is further constructed and arranged to generate a surface design for the panel.

39. The system of claim 38, wherein the processor is further constructed and arranged to generate the surface design by:

identifying an exposed surface of the panel;

determining a border of the exposed surface;

transforming the border of the exposed surface into intersecting lines;

mapping the intersecting lines into a linear approximation to produce a two dimensional surface design;

extracting a border contour for the two dimensional surface design;

mapping a texture design to the two dimensional surface design;

generating a shape contour and a modified texture map corresponding to the two dimensional surface design and texture design.

40. The system of claim 38, wherein the processor is further constructed and arranged to generate the surface design by:

identifying an exposed surface of the panel;

approximating a triangle tessellation to a curvature of the exposed surface;

mapping a triangle to the triangle tessellation;

generating a two dimensional surface design from the mapped triangle;

extracting a border contour for the two dimensional surface design;

mapping a texture design to the two dimensional surface design;

generating a shape contour and a modified texture map corresponding to the two dimensional surface design and texture design.

41. The system of claim 38, wherein the processor is further constructed and arranged to send the surface design to a printer.

42. The system of claim 29, wherein the processor is further constructed and arranged to:

identify a fixture design; and modify the panel to include space for the fixture design.

43. The system of claim 42, wherein the processor is constructed and arranged to identify the fixture design by determining a fixture type.

44. The system of claim 43, wherein the processor is further constructed and arranged to search the database to determine a spatial requirement of the fixture type.

45. The system of claim 42, wherein the processor is constructed and arranged to modify the panel by:

determining at least one best fit line within the panel for the fixture design, the at least one best fit line defining a location within the panel that fits the fixture design; and subtracting a space along the at least one best fit line from the frame design and/or the sheathing design.

46. The system of claim 45, wherein the processor is further constructed and arranged to determine a dimension of the space based on a spatial requirement of the fixture design.

47. The system of claim 45, wherein the processor is further constructed and arranged to subtract an additional space from the frame design and/or the sheathing design based on a spatial requirement of the fixture design.

48. The system of claim 29, wherein the processor is further constructed and arranged to:

identify a fixture design; and generate fabrication instructions for the fixture design.

49. The system of claim 48, wherein the processor is constructed and arranged to generate the fabrication instructions for the fixture design by determining a dimension of a pipe design and/or a conduit design.

50. The system of claim 48, wherein the processor is constructed and arranged to generate the fabrication instructions for the fixture design by:

receiving a maximum dimension for each of a plurality of pipe designs and/or conduit designs;

locating an intersection point where the plurality of pipe designs and/or conduit designs intersect according to the fixture design;

generating a joint design corresponding to the intersection point;

modifying the plurality of pipe designs and/or conduit designs to accept the joint design;

when one of the plurality of pipe designs and/or conduit designs has a dimension greater than the maximum dimension, dividing the one of the plurality of pipe designs and/or conduit designs; and labeling the plurality of pipe designs and/or conduit designs.

51. The system of claim 50, wherein the processor is further constructed and arranged to generate the fabrication instructions for the fixture design by:

receiving a maximum length;

determining a length of each of the plurality of pipe designs and/or conduit designs;

fitting the plurality of pipe designs and/or conduit designs into the maximum length; and generating a specification including the fit of the plurality of pipe designs and/or conduit designs into the maximum length.

52. The system of claim 29, wherein the processor is further constructed and arranged to:

determine an intersection between the panel and another surface; and generate a joint design for the intersection.

53. The system of claim 52, wherein the processor is further constructed and arranged to send the fabrication instructions for the fixture design to a tubing system.

54. The system of claim 52, wherein:

when the intersection is between the panel and a second panel, the joint design is a push joint design and the processor is constructed and arranged to generate the push joint design by extracting a three-dimensional geometry from the panel at a point on the intersection and a corresponding three-dimensional geometry from the second panel at a corresponding point on the intersection; and when the intersection is between the panel and a floor or ceiling, the joint design is a slide joint design and the processor is constructed and arranged to generate the slide joint design by generating a joint hardware element design and extracting a space for the joint hardware element design from the panel.

55. The system of claim 29, wherein the processor is further constructed and arranged to:

generate a visual model of a structure according to the frame design and the sheathing design; and cause the visual model to be displayed on a display.

56. The system of claim 55, wherein the processor is further constructed and arranged to:

receive a user command associated with the visual model; and perform an action in response to the user command, the action comprising modifying the visual model, associating a rating with the visual model, requesting a payment associated with the visual model, and/or generating construction instructions associated with the visual model.

* * * * *